United States Patent
Kainuma et al.

(10) Patent No.: US 10,103,510 B2
(45) Date of Patent: Oct. 16, 2018

(54) OPTICAL MODULE AND METHOD OF MANUFACTURING OPTICAL MODULE

(71) Applicant: FUJITSU LIMITED, Kawasaki-shi, Kanagawa (JP)

(72) Inventors: Norio Kainuma, Nagano (JP); Naoaki Nakamura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/790,119

(22) Filed: Oct. 23, 2017

(65) Prior Publication Data
US 2018/0159300 A1 Jun. 7, 2018

(30) Foreign Application Priority Data
Dec. 1, 2016 (JP) ................................. 2016-234404

(51) Int. Cl.
| | |
|---|---|
| *G02B 6/13* | (2006.01) |
| *H01S 5/125* | (2006.01) |
| *H01S 5/022* | (2006.01) |
| *G02B 6/125* | (2006.01) |
| *G02B 6/30* | (2006.01) |
| *G02B 6/12* | (2006.01) |
| *H01S 5/30* | (2006.01) |

(52) U.S. Cl.
CPC .......... *H01S 5/02272* (2013.01); *G02B 6/125* (2013.01); *G02B 6/13* (2013.01); *H01S 5/02284* (2013.01); *G02B 6/30* (2013.01); *G02B 2006/12119* (2013.01); *G02B 2006/12121* (2013.01); *G02B 2006/12123* (2013.01); *H01S 5/3013* (2013.01)

(58) Field of Classification Search
CPC ............ G02B 6/13; G02B 6/125; H01S 5/022
USPC ............................................... 385/14
See application file for complete search history.

(56) References Cited

U.S. PATENT DOCUMENTS

| | | | | |
|---|---|---|---|---|
| 4,892,377 | A * | 1/1990 | Randle | G02B 6/4202 385/39 |
| 5,237,434 | A * | 8/1993 | Feldman | H01L 23/48 250/551 |
| 5,793,914 | A * | 8/1998 | Sasaki | G02B 6/421 228/165 |
| 5,801,375 | A * | 9/1998 | Sasaki | G01R 13/347 250/216 |
| 6,112,002 | A * | 8/2000 | Tabuchi | G02B 6/4243 385/124 |

(Continued)

FOREIGN PATENT DOCUMENTS

| | | |
|---|---|---|
| JP | 07-235566 | 9/1995 |
| JP | 09-005586 | 1/1997 |
| JP | 2005-038970 | 2/2005 |

*Primary Examiner* — Kaveh C. Kianni
(74) *Attorney, Agent, or Firm* — Fujitsu Patent Center

(57) ABSTRACT

An optical module includes an optical element having a group of first pads which is formed on a first surface thereof, a substrate having a group of second pads which is formed on a second surface thereof facing the first surface so as to correspond to the group of first pads, respectively, and a group of solders that respectively bonds the group of first pads and the group of second pads to each other, wherein, in a plan view, the corresponding first and second pads partially overlap each other, and a center of gravity of the group of first pads coincides with a center of gravity of the group of second pads.

4 Claims, 16 Drawing Sheets

(56) References Cited

U.S. PATENT DOCUMENTS

| | | | | |
|---|---|---|---|---|
| 6,136,623 A * | 10/2000 | Hofstetter | B82Y 20/00 372/50.12 |
| 6,205,264 B1 * | 3/2001 | Jin | B23K 35/0233 385/14 |
| 6,238,100 B1 * | 5/2001 | Sasaki | G02B 6/421 385/59 |
| 6,393,183 B1 * | 5/2002 | Worley | G02B 6/122 257/81 |
| 6,456,766 B1 * | 9/2002 | Shaw | G02B 6/30 385/47 |
| 6,466,349 B1 * | 10/2002 | Valley | G02B 6/4201 398/182 |
| 6,551,650 B1 * | 4/2003 | Carre | G02B 6/4232 228/180.1 |
| 6,583,445 B1 * | 6/2003 | Reedy | H01L 31/101 257/80 |
| 6,807,204 B1 * | 10/2004 | O'Dowd | G02B 6/42 372/25 |
| 6,867,668 B1 * | 3/2005 | Dagostino | H01L 23/66 257/E23.065 |
| 8,428,404 B1 * | 4/2013 | Shubin | G02B 6/12004 385/14 |
| 8,811,779 B2 * | 8/2014 | Tanaka | G02B 6/42 385/129 |
| 9,606,308 B2 * | 3/2017 | Barwicz | G02B 6/4238 |
| 9,608,403 B2 * | 3/2017 | Gambino | H01S 5/02272 |
| 9,817,197 B2 * | 11/2017 | Kinghorn | G02B 6/423 |
| 9,830,937 B1 * | 11/2017 | Hipwell, Jr. | G11B 5/4826 |
| 9,835,797 B1 * | 12/2017 | Dutta | G02B 6/12002 |
| 2002/0071642 A1 * | 6/2002 | Nakata | G02B 6/4232 385/88 |
| 2002/0110335 A1 * | 8/2002 | Wagner | G02B 6/422 385/89 |
| 2002/0168147 A1 * | 11/2002 | Case | G02B 6/2553 385/53 |
| 2003/0002770 A1 * | 1/2003 | Chakravorty | G02B 6/42 385/14 |
| 2003/0205794 A1 * | 11/2003 | Lee | G02B 6/423 257/678 |
| 2003/0228084 A1 * | 12/2003 | Kanda | G02B 6/42 385/14 |
| 2004/0017977 A1 * | 1/2004 | Lam | G02B 6/4204 385/49 |
| 2004/0057648 A1 * | 3/2004 | Yunus | G02B 6/4214 385/14 |
| 2004/0118599 A1 * | 6/2004 | Chason | B81C 1/00333 174/260 |
| 2004/0264865 A1 * | 12/2004 | Joo | G02B 6/2852 385/48 |
| 2005/0224946 A1 * | 10/2005 | Dutta | G02B 6/12002 257/686 |
| 2005/0248909 A1 * | 11/2005 | Kikuchi | H01C 1/06 361/309 |
| 2006/0187798 A1 * | 8/2006 | Ozawa | G02B 6/4204 369/112.09 |
| 2006/0251360 A1 * | 11/2006 | Lu | G02B 6/4232 385/88 |
| 2008/0075405 A1 * | 3/2008 | Wang | G02B 6/1221 385/14 |
| 2008/0291960 A1 * | 11/2008 | Inoue | H01S 5/0425 372/45.01 |
| 2010/0006784 A1 * | 1/2010 | MacK | G02B 6/34 250/551 |
| 2010/0067848 A1 * | 3/2010 | Hwang | G02B 6/4221 385/14 |
| 2010/0232462 A1 * | 9/2010 | Shen | G02B 6/12019 372/36 |
| 2011/0267930 A1 * | 11/2011 | Hurley | G11B 5/105 369/13.32 |
| 2012/0063718 A1 * | 3/2012 | Steijer | G02B 6/4201 385/14 |
| 2013/0015564 A1 * | 1/2013 | Matsuki | H01L 21/561 257/660 |
| 2013/0288077 A1 * | 10/2013 | Dhawan | G11B 13/045 428/815.1 |
| 2016/0091667 A1 * | 3/2016 | Nishizawa | G02B 6/3652 385/14 |
| 2016/0109668 A1 * | 4/2016 | Pfnuer | G02B 6/428 385/3 |
| 2016/0126695 A1 * | 5/2016 | Gambino | H01S 5/02272 372/43.01 |
| 2016/0291265 A1 * | 10/2016 | Kinghorn | G02B 6/131 |
| 2017/0125973 A1 * | 5/2017 | Gambino | H01S 5/02272 |
| 2017/0125974 A1 * | 5/2017 | Gambino | H01S 5/02272 |
| 2017/0131477 A1 * | 5/2017 | Cucci | G02B 6/30 |
| 2017/0160482 A1 * | 6/2017 | Frankel | G02B 6/305 |
| 2017/0186739 A1 * | 6/2017 | Budd | G02B 6/4204 |
| 2017/0194277 A1 * | 7/2017 | Matsumodo | H01L 24/13 |
| 2018/0040597 A1 * | 2/2018 | Budd | G02B 6/4214 |

* cited by examiner

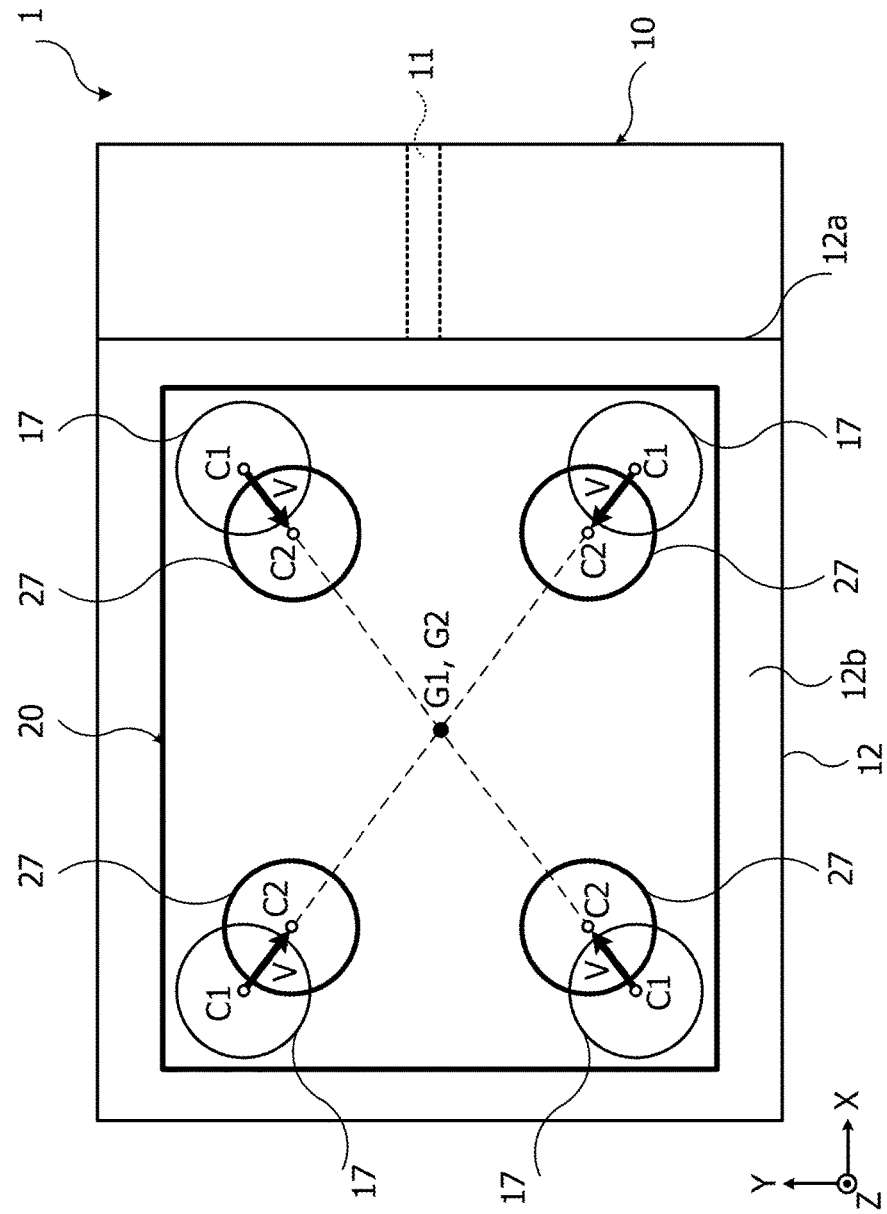

OPTICAL MODULE AND METHOD OF MANUFACTURING OPTICAL MODULE

CROSS-REFERENCE TO RELATED APPLICATION

This application is based upon and claims the benefit of priority of the prior Japanese Patent Application No. 2016-234404, filed on Dec. 1, 2016, the entire contents of which are incorporated herein by reference.

FIELD

The embodiments discussed herein are related to an optical module and a method of manufacturing an optical module.

BACKGROUND

There has been known a technology for mounting an optical element such as a semiconductor laser on a substrate using a solder. For example, there have been known a method of soldering an optical element and a group of electrode pads formed on a substrate at an equal interval using a self-alignment effect generated by surface tension of the solder, and a method of soldering an optical element and a group of metal layers formed on a substrate and having a smaller planar size than the optical element.

In the method in the related art of mounting an optical element on a substrate by soldering using the self-alignment effect, positional precision of the optical element with respect to the substrate may not be sufficiently obtained in some instances. For example, in some instances, a positional deviation of the optical element with respect to the substrate may occur when disturbances such as shaking, vibration, and inclination occur during the soldering of the optical element and the substrate.

The followings are reference documents.
[Document 1] Japanese Laid-Open Patent Publication No. 07-235566 and
[Document 2] Japanese Laid-Open Patent Publication No. 2005-038970.

SUMMARY

According to an aspect of the invention, an optical module includes an optical element having a group of first pads which is formed on a first surface thereof, a substrate having a group of second pads which is formed on a second surface thereof facing the first surface so as to correspond to the group of first pads, respectively, and a group of solders that respectively bonds the group of first pads and the group of second pads to each other, wherein, in a plan view, the corresponding first and second pads partially overlap each other, and a center of gravity of the group of first pads coincides with a center of gravity of the group of second pads.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is an explanatory view of arrangement of a group of pads of the optical module according to the first embodiment;

DESCRIPTION OF EMBODIMENTS

First, an example of a method of mounting an optical element on a substrate will be described with reference to FIGS. 1A to 1C and FIG. 2. Here, a case in which a semiconductor laser is used as the optical element and a silicon photonics chip is used as the substrate will be described as an example.

Figure 1A:
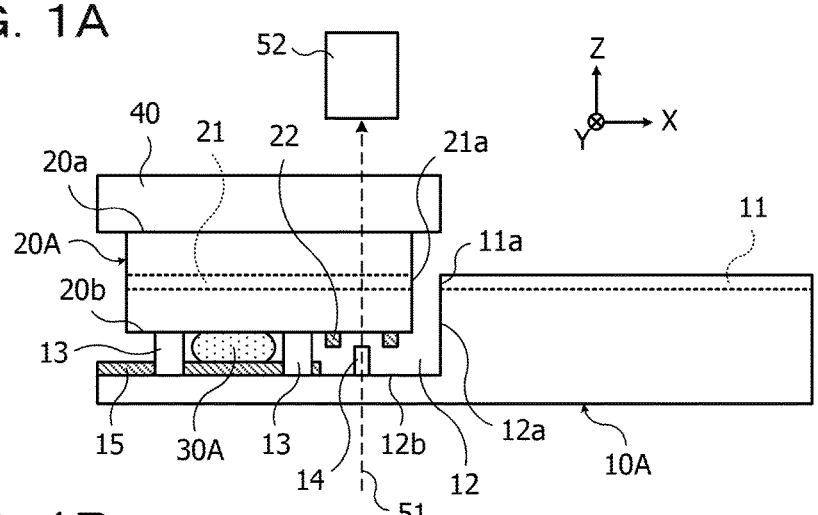
FIGS. 1A to 1C are explanatory views (part 1) of an example of a method of mounting an optical element on a substrate.
Figure 1B:
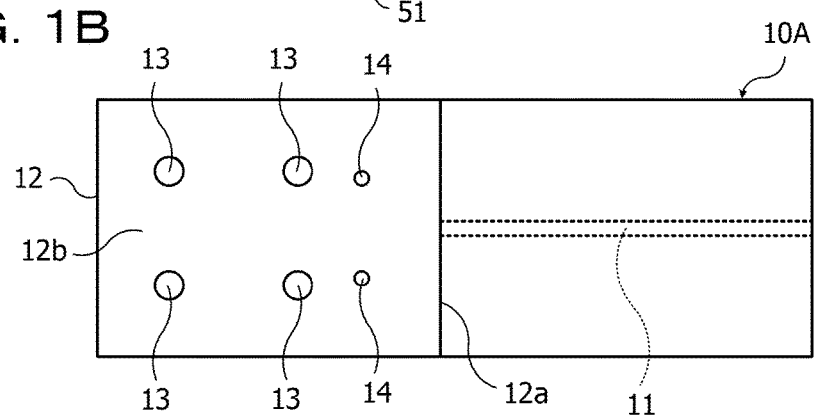
Figure 1C:
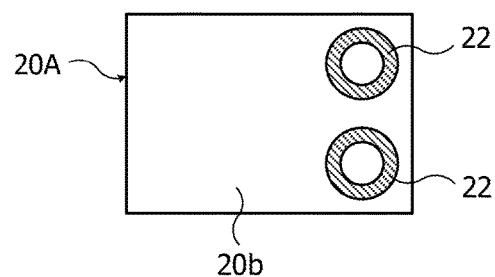

FIG. 1A is a schematic side view of a main part of an example of a process of mounting the semiconductor laser on the silicon photonics chip. FIG. 1B is a schematic top plan view of a main part of the silicon photonics chip in FIG. 1A when viewed from a side facing the semiconductor laser. FIG. 1C is a schematic top plan view of a main part of the semiconductor laser in FIG. 1A when viewed from a side facing the silicon photonics chip.

As illustrated in FIG. 1A, a semiconductor laser 20A is mounted on a silicon photonics chip 10A using a solder 30A. The silicon photonics chip 10A is formed using a silicon (Si) substrate or a silicon-on-insulator (SOI) substrate. As illustrated in FIGS. 1A and 1B, the silicon photonics chip 10A has an optical waveguide 11 and a bottomed recess 12. The semiconductor laser 20A is mounted in the recess 12. For example, the optical waveguide 11 is formed such that an end portion 11a of the optical waveguide 11 is positioned at a sidewall 12a of the recess 12. A plurality of standoffs 13, a plurality of recognition marks 14, and a conductor layer 15 using various types of conductor materials such as copper (Cu) are formed on the bottom surface 12b of the recess 12. Meanwhile, the conductor layer 15 is not illustrated in FIG. 1B.

The standoffs 13 illustrated in FIGS. 1A and 1B may be formed using various types of materials. For example, the standoffs 13 are formed of the silicon of a part of the silicon substrate or the SOI substrate. When the standoffs 13 are mounted such that the upper end of the standoff 13 is in contact with the semiconductor laser 20A, the height of an light projection portion 21a of the semiconductor laser 20A from the bottom surface 12b of the recess 12 is set to coincide with the height of the end portion 11a of the optical waveguide 11 from the bottom surface 12b of the recess 12.

The recognition marks 14 illustrated in FIGS. 1A and 1B are formed using a material that transmits an infrared ray 51. For example, the recognition marks 14 are formed in a columnar shape by the silicon of a part of the silicon substrate or the SOI substrate. The recognition marks 14 are set such that the height of the recognition marks 14 from the bottom surface 12b of the recess 12 is equal to or lower than the height of the standoffs 13. The recognition marks 14 are formed at positions on the bottom surface 12b of the recess 12 which face predetermined portions of the mounted semiconductor laser 20A, in this example, at positions facing inner portions of recognition marks 22 of the semiconductor laser 20A.

For example, the semiconductor laser 20A is formed using various types of compound semiconductor materials such as a gallium arsenide (GaAs) based material, an indium phosphide (InP) based material, and a gallium nitride (GaN) based material. As illustrated in FIGS. 1A and 1C, the semiconductor laser 20A has an active layer 21 which is a light emitting portion, and light generated by the active layer 21 is emitted from the light projection portion 21a of an end face as a laser beam. In addition, although not illustrated here, electrodes are provided on a surface (bottom surface) 20b of the semiconductor laser 20A which faces the bottom surface 12b of the recess 12 of the silicon photonics chip 10A, and a surface (top surface) 20a at the opposite side to the surface (bottom surface) 20b.

The recognition marks 22 are further formed on the bottom surface 20b of the semiconductor laser 20A. The recognition marks 22 are formed using a material that does not transmit the infrared ray 51, or a material that has lower transparency of the infrared ray 51 than the material of the recognition marks 14 of the silicon photonics chip 10A. For example, in a plan view, the recognition marks 22 are separated from the electrode (not illustrated) provided on the bottom surface 20b, and the recognition marks 22 are formed in a doughnut shape using a material such as a metal. The recognition marks 22 are formed at positions on the bottom surface 20b of the semiconductor laser 20A which face predetermined portions of the silicon photonics chip 10A. In this example, when mounting the semiconductor laser 20A, the inner portion of the doughnut-shaped recognition marks 22 are formed at positions that face the recognition marks 14 of the silicon photonics chip 10A, respectively.

When the semiconductor laser 20A is mounted on the silicon photonics chip 10A, the solder 30A is provided in the recess 12 of the silicon photonics chip 10A. The semiconductor laser 20A held by a head 40 of a bonding tool is loaded into the recess 12 in which the solder 30A is provided. Further, the infrared ray 51 is emitted to the position of the recognition mark 14 of the silicon photonics chip 10A from the silicon photonics chip 10A toward the semiconductor laser 20A held by the head 40, and an image of the penetrating infrared ray 51 is captured by an infrared camera 52.

Here, a semiconductor material or a compound semiconductor material which transmits the infrared ray 51 is used for the silicon photonics chip 10A, the recognition mark 14, and the semiconductor laser 20A. A material such as glass, transmits the infrared ray 51, is used for the head 40. Meanwhile, a material such as metal, which does not transmit the infrared ray 51 or hardly transmits the infrared ray 51, is used for the recognition marks 22 of the semiconductor laser 20A. Based on a difference in transparency of the infrared ray 51, the position of the semiconductor laser 20A is adjusted by the head 40 using the image of the infrared camera 52 such that the recognition marks 14 of the silicon photonics chip 10A are positioned to face the inner portions of the recognition marks 22 of the semiconductor laser 20A, respectively.

Figure 2:
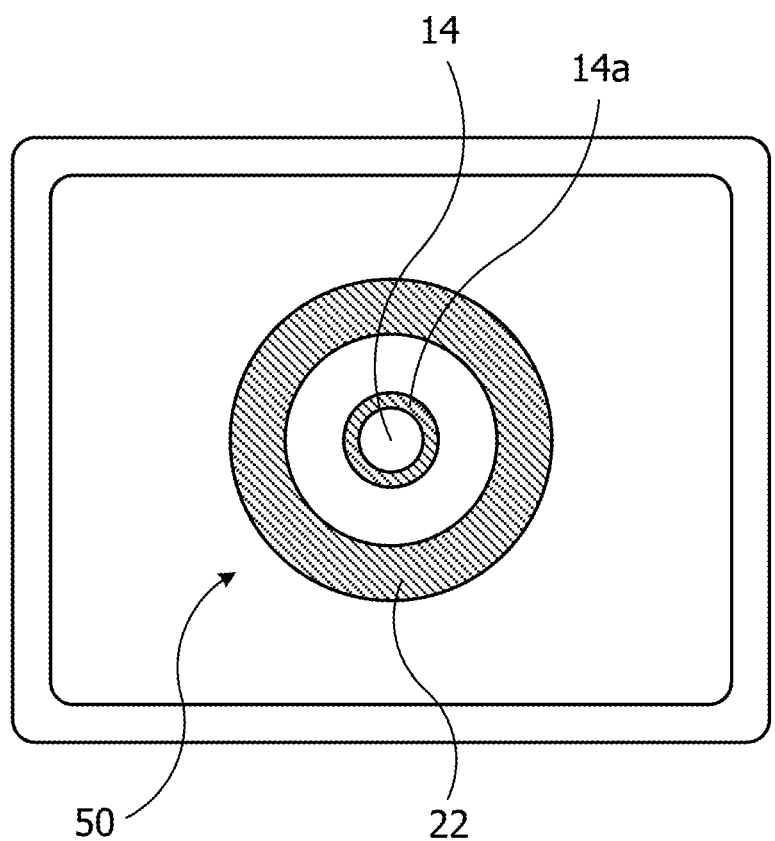
FIG. 2 is an explanatory view (part 2) of the example of the method of mounting the optical element on the substrate.

FIG. 2 is a view illustrating an example of an image captured by the infrared camera. The silicon photonics chip 10A and the columnar recognition mark 14 transmit the infrared ray 51, but the outer circumference 14a of the recognition mark 14 is projected as a shadow onto a captured image 50, as illustrated in FIG. 2, due to a stepped portion formed as the recognition mark 14 protrudes from the bottom surface 12b. Meanwhile, since the doughnut-shaped recognition mark 22 of the semiconductor laser 20A does not transmit or hardly transmits the infrared ray 51, the recognition mark 22 is projected as a doughnut-shaped shadow on the captured image 50, as illustrated in FIG. 2. The position of the semiconductor laser 20A is adjusted by the head 40 such that the recognition mark 14 of the silicon photonics chip 10A is positioned at the inner portion of the doughnut-shaped recognition mark 22 in the image 50. For example, the position of the semiconductor laser 20A is adjusted such that the center of the recognition mark 22 coincides with the center of the recognition mark 14 (outer circumference 14a).

In this way, when the semiconductor laser 20A is positioned at a predetermined position by adjusting the position of the semiconductor laser 20A, the position of the light projection portion 21a of the semiconductor laser 20A and the position of the optical waveguide 11 of the silicon photonics chip 10A coincide with each other in X and Y directions. That is, the recognition marks 22 and the recognition marks 14 are formed in advance such that the position of the light projection portion 21a of the semiconductor laser 20A and the position of the optical waveguide 11 of the silicon photonics chip 10A coincide with each other in the X and Y directions.

After the alignment in the X and Y directions, the semiconductor laser 20A is pressed against the silicon photonics chip 10A by the head 40, the solder 30A is molten by being heated, and then the solder 30A is cooled. Therefore, the bottom surface 20b of the semiconductor laser 20A (the electrode (not illustrated) provided on the bottom surface 20b) and the conductor layer 15 provided on the bottom surface 12b of the silicon photonics chip 10A are bonded to each other by the solder 30A. The Z-direction position of the light projection portion 21a of the semiconductor laser 20A and the Z-direction position of the optical waveguide 11 of the silicon photonics chip 10A are set to match with the height of the standoffs 13 from the bottom surface 12b. That is, the standoff 13 is formed in advance so that the Z-direction position of the light projection portion 21a of the semiconductor laser 20A and the Z-direction position of the optical waveguide 11 of the silicon photonics chip 10A are set to coincide with the height of the standoff 13 from the bottom surface 12b.

By this method, the semiconductor laser 20A is mounted on the silicon photonics chip 10A such that (an optical axis of) the light projection portion 21a is aligned with (an optical axis of) the optical waveguide 11. In the aforementioned method, the alignment between the light projection portion 21a of the semiconductor laser 20A and the optical waveguide 11 of the silicon photonics chip 10A is implemented with a comparatively high precision (e.g., in a single mode, an alignment precision of ±0.5 µm or less).

However, in the aforementioned method, a special facility is used for the mounting and the alignment, which cause an increase in costs, and further, a long period of time is required for the alignment in some instances. In the first place, it is difficult to apply the aforementioned method in a case in which the semiconductor laser 20A and the silicon photonics chip 10A are configured using a material, as a main material, which does not transmit or hardly transmits the infrared ray 51. In addition, the material, which does not transmit or hardly transmits the infrared ray 51, may not be used in an optical path of the infrared ray 51 of the semiconductor laser 20A which enters the inner portion of the doughnut-shaped recognition mark 22. For this reason, a degree of freedom of a wiring layout deteriorates because wiring made of a metal, which does not transmit the infrared ray 51, may not be provided on the optical path of the infrared ray 51 of the semiconductor laser 20A in the case in which the aforementioned method is used for the alignment.

Figure 3A:
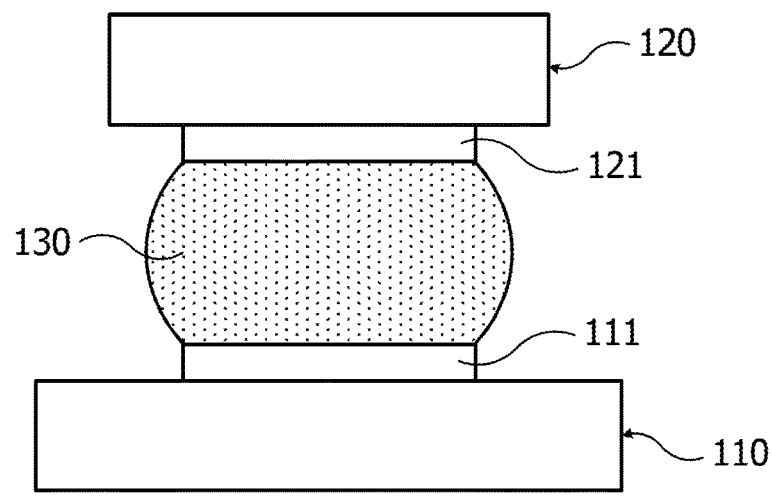
FIGS. 3A and 3B are explanatory views (part 1) of a second example of the method of mounting the optical element on the substrate.
Figure 3B:
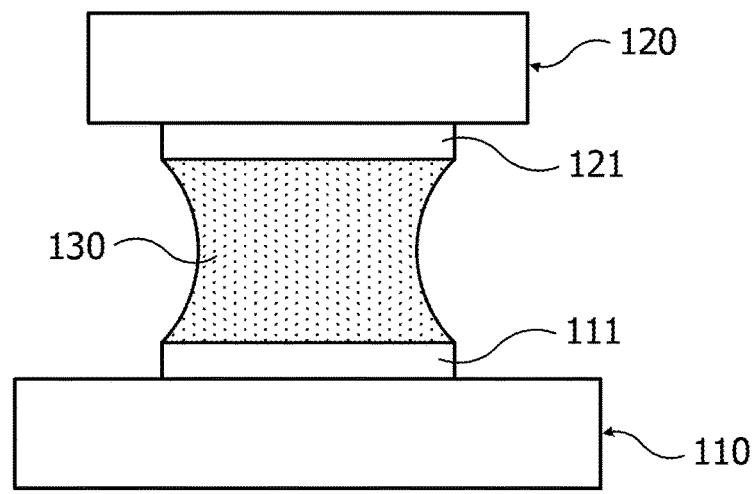

Subsequently, another example of the method of mounting the optical element on the substrate will be described with reference to FIGS. 3A and 3B and FIGS. 4A and 4B. As another example of the method of mounting an optical element on a substrate, there is a method using a self-alignment effect of a solder. FIGS. 3A and 3B are schematic cross-sectional views of main parts of examples of solder joint portions using the self-alignment effect.

As illustrated in FIGS. 3A and 3B, a metallic pad 121 provided on the optical element 120 and a metallic pad 111 provided on the substrate 110 are bonded to each other using a solder 130. When bonding the pads 121 and 111, the solder 130 is molten by being heated, and then solidified by being cooled. When the solder 130 is molten by being heated, the solder 130 is changed into a predetermined shape by surface tension that decreases the surface area of the solder 130, and thereafter, the solder 130 is solidified by being cooled. For example, the solder 130 has an approximately spherical shape (convex shape) of which the central portion is expanded, as illustrated in FIG. 3A, or the solder 130 has a constricted shape (concave shape) of which the central portion is constricted, as illustrated in FIG. 3B. As such, the optical element 120 is aligned and mounted on the substrate 110 using the nature of the solder 130 of which the shape is changed into a predetermined shape by surface tension when the solder 130 is molten.

However, in some instances, a sufficient position precision may not be obtained by this method. This will be described with reference to FIGS. 4A and 4B. Here, a case in which a semiconductor laser is used as an optical element and a silicon photonics chip is used as a substrate will be described as an example.

Figure 4A:
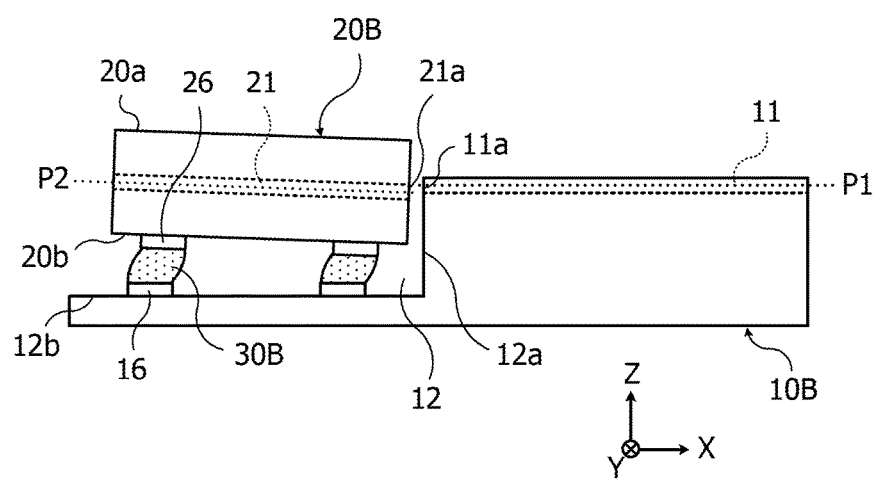
FIGS. 4A and 4B are explanatory views (part 2) of the second example of the method of mounting an optical element on a substrate.
Figure 4B:
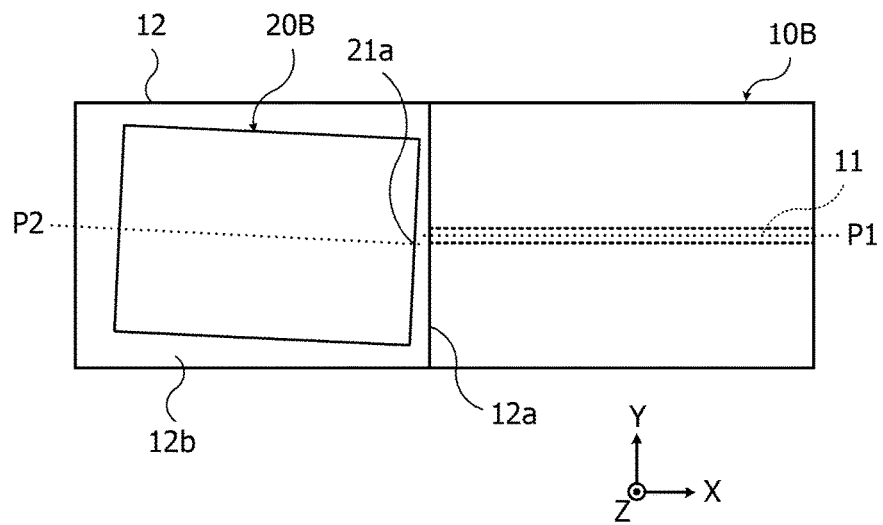

FIG. 4A is a schematic side view of a main part of another example of a process of mounting a semiconductor laser on a silicon photonics chip. FIG. 4B is a schematic top plan view of a main part of another example of a process of mounting the semiconductor laser on the silicon photonics chip.

As illustrated in FIGS. 4A and 4B, a semiconductor laser 20B is mounted on a silicon photonics chip 10B using a group of solders 30B. The silicon photonics chip 10B is formed using a silicon substrate or an SOI substrate. The silicon photonics chip 10B has an optical waveguide 11 and a recess 12. The semiconductor laser 20B is mounted in the recess 12. For example, the optical waveguide 11 is formed such that an end portion 11a of the optical waveguide 11 is positioned at a sidewall 12a of the recess 12. A plurality of pads 16 made of various types of conductor materials such as copper is provided on the bottom surface 12b of the recess 12.

For example, the semiconductor laser 20B is formed using various types of compound semiconductor materials such as a gallium arsenide based material, an indium phosphide based material, and a gallium nitride based material. The semiconductor laser 20B emits light generated by an active layer 21 which is a light emitting part, as a laser beam from the light projection portion 21a of an end face. Meanwhile, although not illustrated here, electrodes are provided on the bottom surface 20b of the semiconductor laser 20B which faces the bottom surface 12b of the recess 12 of the silicon photonics chip 10B, and a top surface 20a at the opposite side to the bottom surface 20b. A plurality of pads 26, which corresponds to the group of pads 16 of the silicon photonics chip 10B, is provided on the bottom surface 20b of the semiconductor laser 20B.

The corresponding pads 16 and 26 are formed in advance at opposite positions so that the position of the light projection portion 21a of the semiconductor laser 20A and the position of the optical waveguide 11 of the silicon photonics chip 10B coincide with each other in the X and Y directions when the corresponding pads 16 and 26 are bonded by the normal self-alignment effect. Further, the amount of the group of solders 30B is set in advance such that the position of the light projection portion 21a and the position of the optical waveguide 11 coincide with each other in the Z direction when the pads 16 and 26 at the opposite positions are bonded by the normal self-alignment effect. Therefore, the alignment between the light projection portion 21a and the optical waveguide 11 (alignment between the optical axes) may be performed by bonding the pads 16 and 26 at the opposite positions with the solder 30B and by using the alignment effect obtained by the solder 30B in this case.

However, disturbances such as shaking, vibration, and inclination occur during the bonding of the pads 16 and 26 at the opposite positions with the solder 30B, and as a result, there is a concern that a positional deviation may occur as illustrated in FIGS. 4A and 4B when the normal self-alignment effect may not be obtained due to the disturbances.

That is, when the disturbance occurs during the bonding of the pads, a balance of surface tension of the group of molten solders 30B collapses, and as a result, in some instances, the group of solders 30B having a predetermined shape with balanced surface tension, like the solder 130 exemplified in FIG. 3A and the like, may not be obtained. As a result, there is a concern that a positional deviation (deviations of optical axes P1 and P2) in the Z-direction illustrated in FIG. 4A or a positional deviation (deviations of the optical axes P1 and P2) in the X and Y directions illustrated in FIG. 4B occur between the light projection portion 21a of the semiconductor laser 20B and the optical waveguide 11 of the silicon photonics chip 10B.

In consideration of the aforementioned situations, the optical element is mounted on the substrate by adopting the methods described herein through the following embodiments. First, a first embodiment will be described.

Figure 5A:
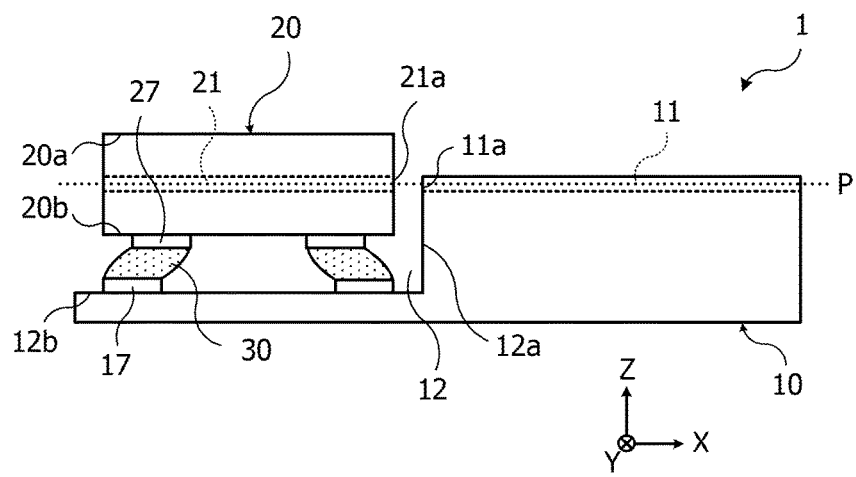
FIGS. 5A and 5B are views illustrating an example of an optical module according to a first embodiment.
Figure 5B:
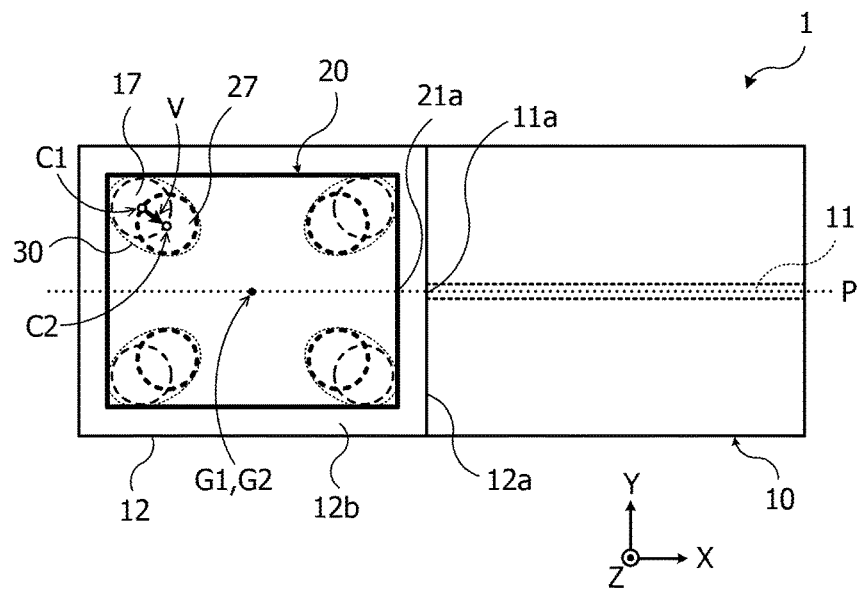

Here, a case in which a semiconductor laser is used as an optical element and a silicon photonics chip is used as a substrate will be described as an example. FIGS. 5A and 5B are views illustrating an example of an optical module according to the first embodiment. FIG. 5A illustrates a schematic side view of a main part of an example of the optical module, and FIG. 5B illustrates a schematic top plan view of the main part of an example of the optical module.

An optical module 1 illustrated in FIGS. 5A and 5B includes a silicon photonics chip 10, a semiconductor laser 20, and a group of solders 30. The silicon photonics chip 10 is formed using a silicon substrate or an SOI substrate. The silicon photonics chip 10 has an optical waveguide 11 and a recess 12. The semiconductor laser 20 is mounted in the recess 12. For example, the optical waveguide 11 is formed such that an end portion 11a of the optical waveguide 11 is positioned at a sidewall 12a of the recess 12. A plurality of pads 17 is provided on a bottom surface 12b of the recess 12. Here, an example in which the group of four planar circular pads 17 is provided on the bottom surface 12b of the recess 12 is illustrated.

For example, each of the pads 17 may have a lamination structure which includes a lower layer portion provided on the bottom surface 12b of the recess 12, and an upper layer portion provided on the top surface of the lower layer portion. In this case, for example, the lower layer portion may be formed by the silicon of a part of the silicon substrate or the SOI substrate. For example, the upper layer portion may be formed using a material such as copper, nickel (Ni), and gold (Au) to which the solder 30, which is molten by being heated as described below, gets wet. In addition, the pads 17 may have a single layer structure which does not include the lower layer portion, that is, a structure in which the material which gets wet with the molten solder 30 is formed directly on the bottom surface 12b of the recess 12. The configuration example of the pad 17 will be described below (second embodiment).

For example, the semiconductor laser 20 is formed using various types of compound semiconductor materials such as a gallium arsenide based material, an indium phosphide based material, and a gallium nitride based material. The semiconductor laser 20 emits light generated by an active layer 21 which is a light emitting part, as a laser beam from the light projection portion 21a of an end face. In addition, although not illustrated here, electrodes are provided on the bottom surface 20b of the semiconductor laser 20 which faces the bottom surface 12b of the recess 12 of the silicon photonics chip 10, and the top surface 20a at the opposite side to the bottom surface 20b. A plurality of pads 27, which corresponds to the group of pads 17 of the silicon photonics chip 10, is provided on the bottom surface 20b of the semiconductor laser 20. Here, an example in which the group of four planar circular pads 27, which has the same planar size as the group of four pads 17 of the silicon photonics chip 10, is provided on the bottom surface 20b of the semiconductor laser 20 is illustrated.

Here, the arrangement of the group of pads 17 of the silicon photonics chip 10 and the group of pads 27 of the semiconductor laser 20 will be described with reference to FIGS. 5A and 5B and FIG. 6.

FIG. 6 is an explanatory view of the arrangement of a group of pads of the optical module according to the first embodiment. FIG. 6 illustrates a schematic top plan view of a main part of the optical module, and for ease of description, a group of pads of the silicon photonics chip and a group of pads of the semiconductor laser are perspectively illustrated, and a solder by which the corresponding pads are bonded to each other is not illustrated.

For example, as illustrated in FIGS. 5A and 5B and FIG. 6, the group of pads 27 of the semiconductor laser 20 is provided at four corners of the bottom surface 20b. The group of four pads 17 of the silicon photonics chip 10 is provided to correspond to the group of pads 27 at the four corners of the semiconductor laser 20, respectively. The group of pads 17 of the silicon photonics chip 10 and the group of pads 27 of the semiconductor laser 20 are provided such that, in a plan view, the corresponding pads 17 and 27 partially overlap and a center of gravity G1 of the group of pads 17 and a center of gravity G2 of the group of pads 27 coincide with each other.

The center of gravity G1 is a center of gravity of a group of central points C1 when it is assumed that the central points of the pads 17 of the silicon photonics chip 10 is C1, and the center of gravity G2 is a center of gravity of a group of central points C2 when it is assumed that the central points of the pads 27 of the semiconductor laser 20 is C2.

For example, as illustrated in FIGS. 5A and 5B and FIG. 6, the group of pads 17 is disposed to be displaced outward from the group of pads 27 such that, in a plan view, the corresponding pads 17 and 27 partially overlap and the center of gravity G1 of the group of pads 17 and the center of gravity G2 of the group of pads 27 coincide with each other. The corresponding pads 17 and 27 of the group of pads 17 and the group of pads 27 are disposed such that, in a plan view, the central points C1 and C2 are displaced and a vector V, which interconnects the central points C1 and C2, is disposed toward the centers of gravity G1 and G2 which coincide with each other.

For example, the group of pads 17 and the group of pads 27, which are disposed as described above, are bonded to each other by the solder 30, as illustrated in FIGS. 5A and 5B. For example, a soldering material containing tin (Sn) may be used for the group of solders 30. In the optical module 1, as the group of pads 17 and the group of pads 27 are bonded to each other by the solders 30, the position of the light projection portion 21a of the semiconductor laser 20 and the position of the optical waveguide 11 of the silicon photonics chip 10 coincide with each other in the X, Y, and Z directions, and the optical axis P of the light projection portion 21a and the optical axis P of the optical waveguide 11 coincide with each other. That is, the positions, the planar sizes, the planar shapes, the materials, and the like of the group of pads 17 and the group of pads 27 and the amount, the material, and the like of the group of solders 30 are set in advance such that the position of the light projection portion 21a of the semiconductor laser 20 and the position of the optical waveguide 11 of the silicon photonics chip 10 coincide with each other in the X, Y, and Z directions, and the optical axis P of the light projection portion 21a and the optical axis P of the optical waveguide 11 coincide with each other.

Since the corresponding pads 17 and 27 are disposed as described above, force by the surface tension of the solder 30 molten during the bonding of the pads 17 and 27 is applied to the semiconductor laser 20 toward the outside of the semiconductor laser 20. As this force is applied, an influence of the disturbance on the position of the semiconductor laser 20 bonded on the silicon photonics chip 10 is inhibited. Therefore, it is possible to obtain the optical module 1 in which the positional deviation of the semiconductor laser 20 on the silicon photonics chip 10 is inhibited, and the optical axes P coincide with each other with a high precision. This will be further described with reference to FIGS. 7A and 7B and FIG. 8.

Figure 7A:
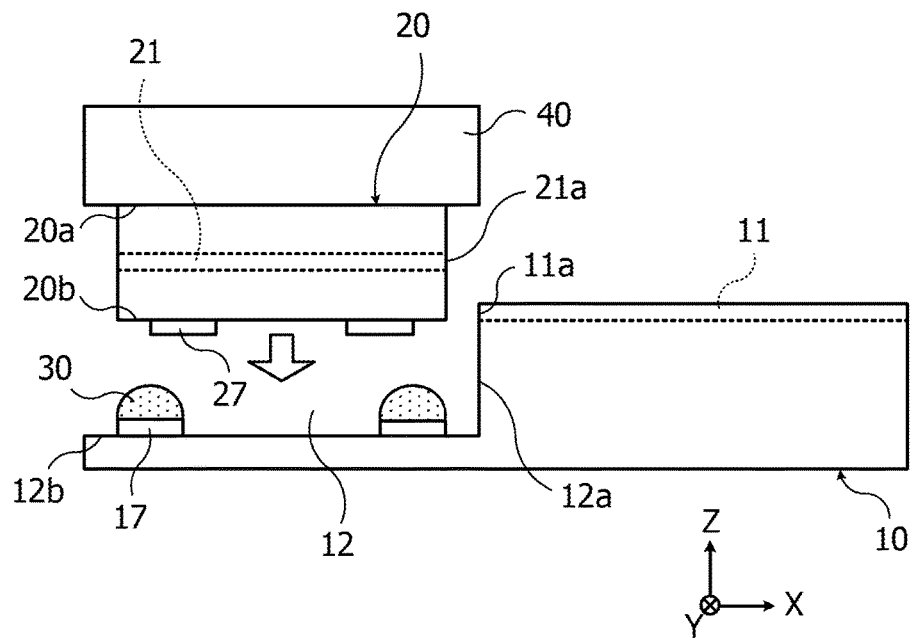
FIGS. 7A and 7B are an explanatory view of formation of the optical module according to the first embodiment.
Figure 7B:
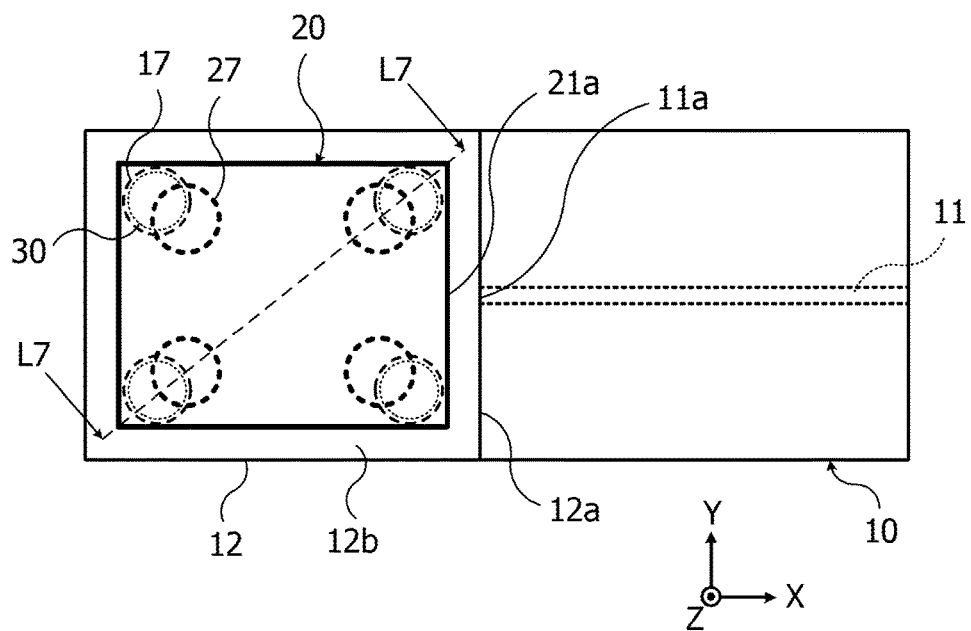

FIGS. 7A and 7B are an explanatory view of formation of the optical module according to the first embodiment. FIG. 7A illustrates a schematic side view of a main part of an example before soldering, and FIG. 7B illustrates a schematic top plan view of the main part of the example before soldering. In addition, the bonding tool is not illustrated in FIG. 7B for convenience.

The solders 30 are respectively provided by, for example, a plating method, on the pads 17 of the silicon photonics chip 10 which is formed with an optical waveguide 11 and a recess 12 and has a group of pads 17 provided at the predetermined positions of the bottom surface 12b of the recess 12, as illustrated in FIGS. 7A and 7B. In addition, the semiconductor laser 20, which has the active layer 21 and the group of pads 27 provided at the predetermined positions of the bottom surface 20b and is illustrated in FIGS. 7A and 7B, is prepared.

The prepared semiconductor laser 20 is held by the head 40 (FIG. 7A) of the bonding tool and loaded to the recess 12 of the silicon photonics chip 10 having the pads 17 on which the solders 30 are provided, respectively. The semiconductor laser 20 loaded to the recess 12 by the head 40 is aligned first with a comparatively rough precision so that the group of pads 27 of the semiconductor laser 20 and the group of solders 30 provided on the silicon photonics chip 10 partially overlap in a plan view.

Thereafter, the semiconductor laser 20 is pressed against the silicon photonics chip 10 by the head 40 (indicated by a thick arrow in FIG. 7A) such that the group of pads 27 comes into contact with the group of solders 30, respectively. In addition, for example, the group of solders 30 is heated and molten by a heating device provided in the head 40.

The molten solder 30 gets wet on a surface (the tip surface in FIG. 7A) of the corresponding pad 17 and a surface (bottom surface in FIG. 7A) of the pad 27. The surface tension, which decreases a surface area of the solder 30, is applied to the molten solder 30. The semiconductor laser 20 is displaced to a position where force generated by the surface tension of the group of molten solder 30 is balanced.

Figure 8:
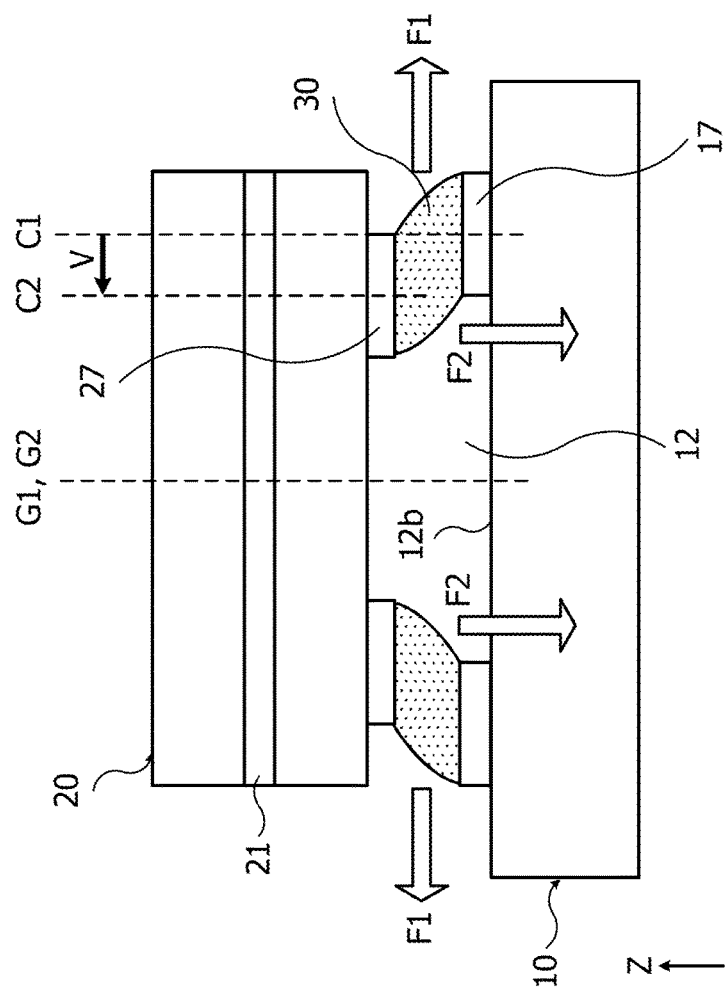
FIG. 8 is an explanatory view of soldering according to the first embodiment.

Here, FIG. 8 is an explanatory view of soldering according to the first embodiment. FIG. 8 schematically illustrates soldering at a position corresponding to a cross section taken along line L7-L7 in FIG. 7B. As described above, surface tension is applied to the group of solders 30 which are molten by being heated and get wet on the surfaces of the corresponding pads 17 and 27. In this example, as illustrated in FIG. 8, one pad 17 of the silicon photonics chip 10 is provided at a position displaced outward with respect to the pad 27 of the semiconductor laser 20 which corresponds to the pad 17. For this reason, force F1, which pulls the semiconductor laser 20 outward, is applied to the semiconductor laser 20 by the surface tension of the molten solder 30.

The force F1, which pulls the semiconductor laser 20 outward, is applied to the corresponding pads 17 and 27 of the group of pads 17 and the group of pads 27, and the semiconductor laser 20 is stopped at a position where the force F1 is balanced. For example, in this case, the center of gravity G2 of the group of pads 27 coincide with the center of gravity G1 of the group of pads 17, and the corresponding pads 17 and 27 are disposed such that the pad 27 is displaced outward from the pad 17 and the vector V, which interconnects the central points C1 and C2, is directed toward the coinciding centers of gravity G1 and G2.

As described above, the force F1, which pulls the semiconductor laser 20 outward, is applied to the semiconductor laser 20 by the surface tension of the molten solder 30. Even though disturbances such as shaking, vibration, and inclination occur when the group of solders 30 is molten, the semiconductor laser 20 is pulled outward against the disturbances, and the position of the semiconductor laser 20 is determined in the X and Y directions by the balance of the force F1.

The group of solders 30, which is molten by being heated, is solidified by being cooled thereafter. The volumetric shrinkage of the group of solders 30 occurs when the group of solders 30 is solidified. By the volumetric shrinkage, as illustrated in FIG. 8, force F2, which allows the semiconductor laser 20 to sink to the bottom surface 12b of the recess 12 of the silicon photonics chip 10, is applied to the semiconductor laser 20. The position of the semiconductor laser 20 is determined in the Z direction by the force F2.

The position of the semiconductor laser 20 is determined in the X, Y, and Z directions by the self-alignment effect generated by the force F1 and the force F2 exhibited by the group of solders 30 when performing the bonding including the melting and the solidifying of the group of solders 30. When the semiconductor laser 20 is bonded while the semiconductor laser 20 is aligned in the X, Y, and Z directions by the force F1 and the force F2, the position of the light projection portion 21a of the laser beam coincides with the position of the optical waveguide 11 of the silicon photonics chip 10. That is, when the semiconductor laser 20 is bonded onto the silicon photonics chip 10 by the group of solders 30, the optical axes P of the semiconductor laser 20 and the silicon photonics chip 10 coincide with each other by the self-alignment effect of the group of solders 30.

The group of pads 27, the group of pads 17, and the group of solders 30 are set in advance on the semiconductor laser 20 and the silicon photonics chip 10 such that the optical axes P coincide with each other by the self-alignment effect when the semiconductor laser 20 is bonded onto the silicon photonics chip 10 by the group of solders 30 as described above. For example, the positions, the planar sizes, the planar shapes, the materials, and the like of the group of pads 27 and the group of pads 17 and the amount, the material, and the like of the group of solders 30 are set in advance such that the optical module 1 in which the optical axes P coincide with each other when the semiconductor laser 20 is bonded on the silicon photonics chip 10 by the group of solders 30 may be obtained.

The positions, the planar sizes, the planar shapes, the materials, and the like of the group of pads 27 and the group of pads 17 and the amount, the material, and the like of the group of solders 30 may be obtained by calculation using, for example, a computer or the like. The group of pads 27, the group of pads 17, and the group of solders 30 may be formed with a precision sufficient to allow the optical axes P to coincide with each other by the self-alignment effect by using a photolithography technology, an etching technology, a film forming technology, a machining technology, or the like used in the semiconductor field.

According to the method described in the first embodiment, since the self-alignment effect of the group of solders 30 is used, a special and expensive facility such as the facility, which performs the alignment using the infrared ray (FIGS. 1A to 1C and FIG. 2), is not required, and the period of time required for the alignment is reduced. Therefore, the optical module 1 may be effectively obtained by inhibiting an increase in costs.

According to the method, it is not necessary to configure the semiconductor laser 20 and the silicon photonics chip 10 as the structure (FIGS. 1A to 1C and FIG. 2) capable of performing the alignment using the infrared ray. For example, it is not necessary to provide a structure in which a recognition mark, which transmits the infrared ray, and a recognition mark, which does not transmit the infrared ray, are provided as a pair at a predetermined position, or a structure in which wiring, which does not transmit the infrared ray, is not provided on an optical path of the infrared ray. The aforementioned method may be adopted for various semiconductor lasers 20 and various silicon photonics chips 10 without causing a structural restriction.

According to the method, when the bonding is performed by the group of solders 30, the self-alignment effect of the group of solders 30 is realized while inhibiting influences of disturbances such as shakiness, vibration, and an inclination. Therefore, the optical axes P of the semiconductor laser 20 and the silicon photonics chip 10 may coincide with each other with high precision by bonding the semiconductor laser 20 and the silicon photonics chip 10 while inhibiting the influence of the disturbance.

In the first embodiment, the optical module 1 in which the single semiconductor laser 20 is mounted in (bonded to) the recess 12 of the silicon photonics chip 10 having the single optical waveguide 11 has been described, but the configuration of the optical module is not limited to this example.

For example, there may be a configuration in which the silicon photonics chip 10 has a plurality of optical waveguides 11 provided in parallel, and a plurality of the same or different semiconductor lasers 20, which corresponds to the plurality of optical waveguides 11, is mounted in the recess 12 of the silicon photonics chip 10. In this case, the method described in the first embodiment may be adopted for the joint portion between the semiconductor laser 20 and the silicon photonics chip 10.

The optical waveguide 11, which is curved or has a curved portion, may be provided on the silicon photonics chip 10 without being limited to the optical waveguide 11 having a straight shape. Furthermore, a modulator for modulating light to be transmitted to the optical waveguide 11 may be provided on the silicon photonics chip 10.

Next, a second embodiment will be described. Here, a configuration example of a joint portion will be described as the second embodiment in a case in which the semiconductor laser 20 is used as the optical element, the silicon photonics chip 10 is used as the substrate, and the semiconductor laser 20 and the silicon photonics chip 10 are bonded.

Figure 9A:
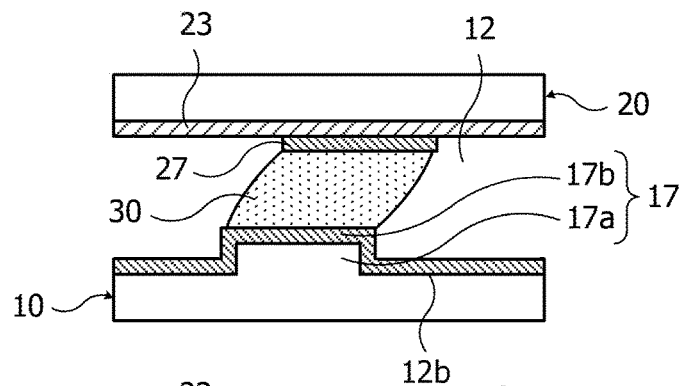
FIGS. 9A to 9D are views illustrating a configuration example of a joint portion according to a second embodiment.
Figure 9B:
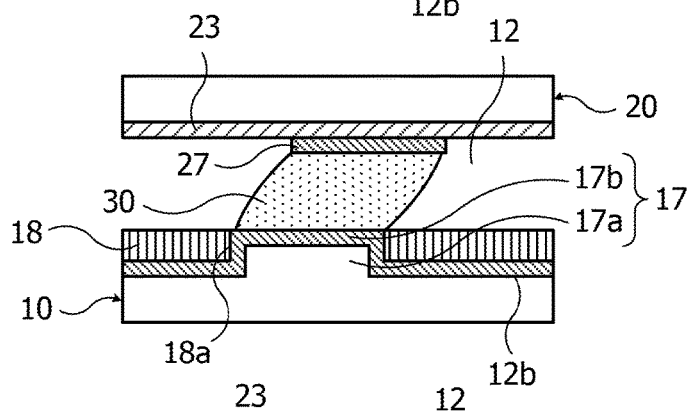
Figure 9C:
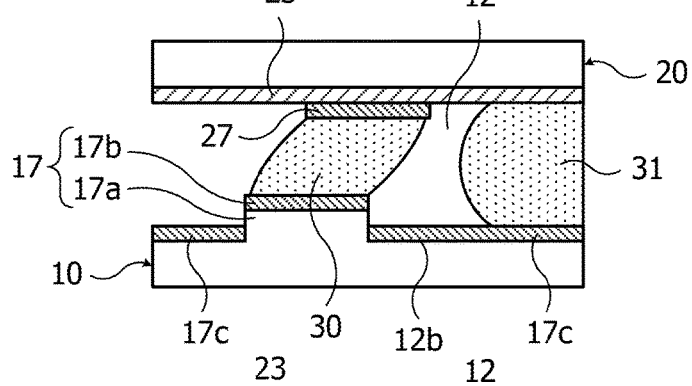
Figure 9D:
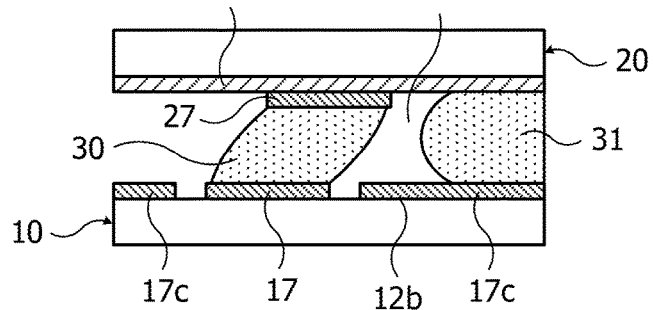

FIGS. 9A to 9D are views illustrating the configuration example of the joint portion according to the second embodiment. FIG. 9A is a schematic cross-sectional view of a main part illustrating a first configuration example of the joint portion, FIG. 9B is a schematic cross-sectional view of a main part illustrating a second configuration example of the joint portion, FIG. 9C is a schematic cross-sectional view of a main part illustrating a third configuration example of the joint portion, and FIG. 9D is a schematic cross-sectional view of a main part illustrating a fourth configuration example of the joint portion.

FIGS. 9A to 9D schematically illustrate a part of the joint portion between the silicon photonics chip 10 and the semiconductor laser 20. As illustrated in FIG. 9A, the pad 17 of the silicon photonics chip 10 may have a lamination structure including a lower layer portion 17a provided on the bottom surface 12b of the recess 12, and an upper layer portion 17b provided on the top surface of the lower layer portion 17a. The lower layer portion 17a may be formed as a part of the silicon substrate used for the silicon photonics chip 10, and the upper layer portion 17b may be formed by using various types of conductor materials such as copper. In the example in FIG. 9A, the upper layer portion 17b is formed across the bottom surface 12b of the recess 12 from the top surface of the lower layer portion 17a. An electrode 23 (a cathode or an anode) for supplying electric power to the semiconductor laser 20 is provided on the bottom surface 20b of the semiconductor laser 20. The pad 27 of the semiconductor laser 20 is provided to be electrically connected to the electrode 23 at a position displaced from the pad 17 of the silicon photonics chip 10.

The pad 27 and the pad 17 illustrated in FIG. 9A are bonded to each other by the solder 30 as described in the first embodiment such that the electrode 23 of the semiconductor laser 20 is electrically connected to the upper layer portion 17b of the pad 17 through the pad 27 and the solder 30. Therefore, an electric power path is formed between the silicon photonics chip 10 and the semiconductor laser 20. As such, the pad 17 of the silicon photonics chip 10 and the pad 27 of the semiconductor laser 20 may be used as electric power terminals in addition to the purpose of the alignment (alignment between the optical axes).

As illustrated in FIG. 9B, the upper layer portion 17b of the pad 17 of the silicon photonics chip 10 may be covered with a protective film 18 having an opening 18a at a position where the pads are used as the electric power terminals. The protective film 18 may be made of an insulating material such as a solder resist, or may be made of a conductor material that has lower wettability of the molten solder 30 than the upper layer portion 17b.

As illustrated in FIG. 9C, the upper layer portion 17b of the pad 17 of the silicon photonics chip 10 may be formed on the top surface of the lower layer portion 17a so as to be separated from a conductor layer 17c provided on the bottom surface 12b of the recess 12. The pad 17 having the upper layer portion 17b is not used as the electric power terminal, but is used for the alignment with the semiconductor laser 20 (alignment between the optical axes). In this case, for example, as illustrated in FIG. 9C, the conductor layer 17c and the electrode 23 of the semiconductor laser 20 are bonded to each other by a conductive bonding material 31 (partially illustrated) such as solder such that the electric power path is formed between the silicon photonics chip 10 and the semiconductor laser 20.

As illustrated in FIG. 9D, the pad 17 of the silicon photonics chip 10 may have a single layer structure. In this case, the pad 17 may be formed using various types of conductor materials such as copper. The conductor layer 17c is provided on the bottom surface 12b of the recess 12 so as to be separated from the pad 17. The pad 17 is not used as the electric power terminal, but is used for the alignment with the semiconductor laser 20 (alignment between the optical axes). In this case, for example, as illustrated in FIG. 9D, the conductor layer 17c and the electrode 23 of the semiconductor laser 20 are bonded by the bonding material 31 (partially illustrated) such as solder, such that the electric power path is formed between the silicon photonics chip 10 and the semiconductor laser 20.

In the case in which the bonding material 31 illustrated in FIGS. 9C and 9D is used, for example, after the semiconductor laser 20 is bonded by the solder 30 (after the alignment with the optical axis of the optical waveguide 11), the bonding material 31 is provided between the bonded semiconductor laser 20 and the bonded silicon photonics chip 10. Otherwise, the bonding material 31 is provided in advance on the conductor layer 17c of the silicon photonics chip 10 before the semiconductor laser 20 is bonded (before the semiconductor laser 20 is loaded to the recess 12), and then the semiconductor laser 20 is aligned and bonded by the solder 30, and additionally bonded by the bonding material 31. In either of the methods, a bonding material, which has a melting point or a solidifying point lower than a melting point or a solidifying point of the solder 30, may be used as the bonding material 31.

As described in the second embodiment, the pad 17 of the silicon photonics chip 10 may be provided for the alignment (alignment between the optical axes) or provided to be used as the electric power terminal together, and various types of configurations illustrated in FIGS. 9A to 9D may be adopted.

The joint portion with the semiconductor laser 20 in the case in which the configuration of the silicon photonics chip 10 is changed has been described here, but various types of configurations may also be adopted for the semiconductor laser 20.

Next, a third embodiment will be described. Here, an example of an optical module, in which the semiconductor laser 20 is used as the optical element, the silicon photonics chip 10 is used as the substrate, and another arrangement of the group of pads 17 and the group of pads 27 is adopted, will be described as the third embodiment.

Figure 10A:
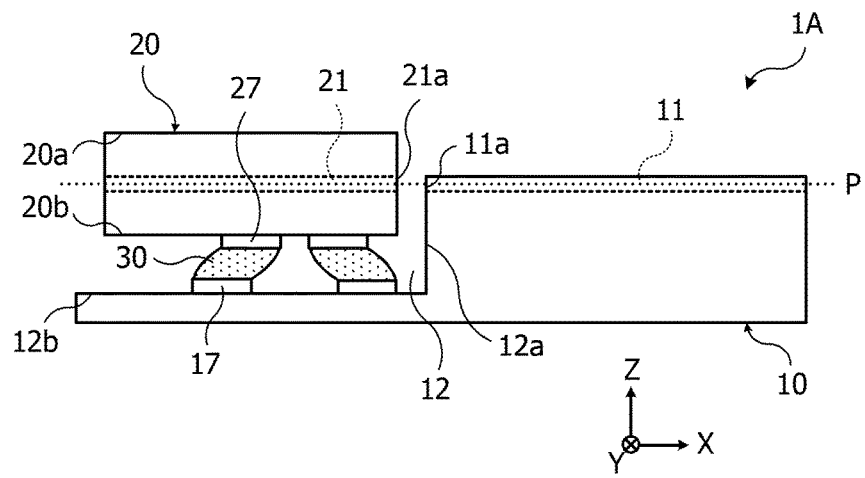
FIGS. 10A and 10B are views illustrating a first example of an optical module according to a third embodiment.
Figure 10B:
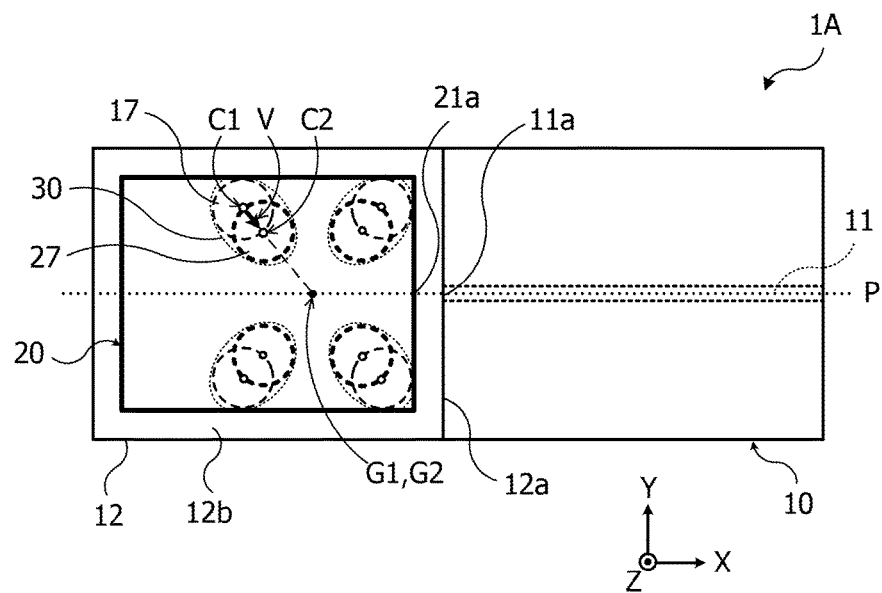

FIGS. 10A and 10B are views illustrating a first example of the optical module according to the third embodiment. FIG. 10A illustrates a schematic side view of a main part of an example of the optical module, and FIG. 10B illustrates a schematic top plan view of the main part of an example of the optical module.

An optical module 1A illustrated in FIGS. 10A and 10B has a configuration in which the group of pads 27 is provided at positions different from four corners of the semiconductor laser 20, and the group of pads 17 is provided on the silicon photonics chip 10 so as to correspond to the group of pads 27. The semiconductor laser 20 and the silicon photonics chip 10, which have the aforementioned configuration, are bonded by the group of solders 30. From this point of view, the optical module 1A is different from the optical module 1 described in the first embodiment.

In the optical module 1A, in a plan view of the group of pads 17 and the group of pads 27, the group of pads 17 is provided outside the group of pads 27, the corresponding pads 17 and 27 partially overlap, and the center of gravity G1 of the group of pads 17 coincides with the center of gravity G2 of the group of pads 27. The vector V, which interconnects the central points C1 and C2 of the corresponding pads 17 and 27, is disposed to be directed toward the coinciding centers of gravity G1 and G2. Since the group of pads 17 and the group of pads 27 are bonded by the group of solders 30 as described above, the position of the light projection portion 21a of the semiconductor laser 20 is aligned in the X, Y, and Z directions with respect to the optical waveguide 11 of the silicon photonics chip 10, and the optical axes P of the light projection portion 21a and the optical waveguide 11 are aligned.

The group of pads 27, the group of pads 17, and the group of solders 30 are set in advance such that the optical module 1A, in which the optical axes P are aligned as illustrated in FIGS. 10A and 10B by the self-alignment effect when the group of pads 17 and the group of pads 27 are bonded by the group of solders 30, may be obtained. For example, the positions, the planar sizes, the planar shapes, the materials, and the like of the group of pads 27 and the group of pads 17 and the amount, the material, and the like of the group of solders 30 are set in advance.

Figure 11A:
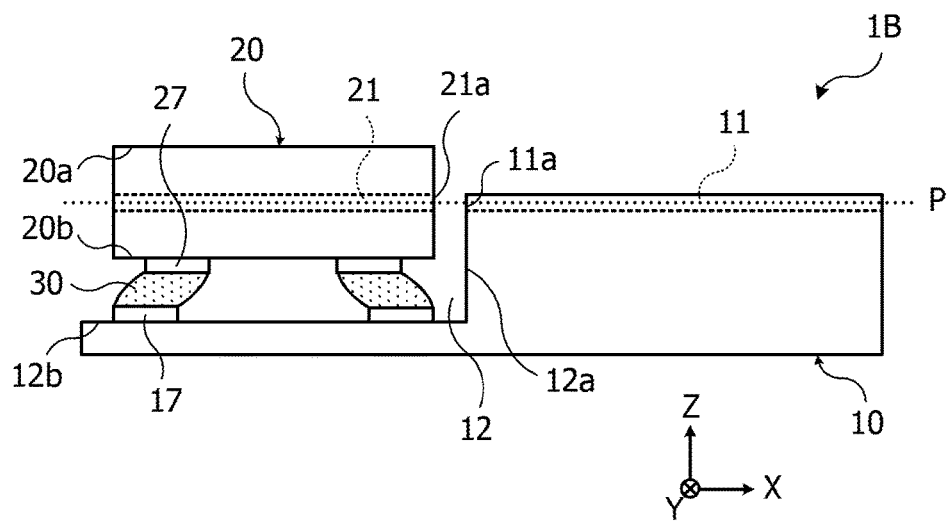
FIGS. 11A and 11B are views illustrating a second example of the optical module according to the third embodiment.
Figure 11B:
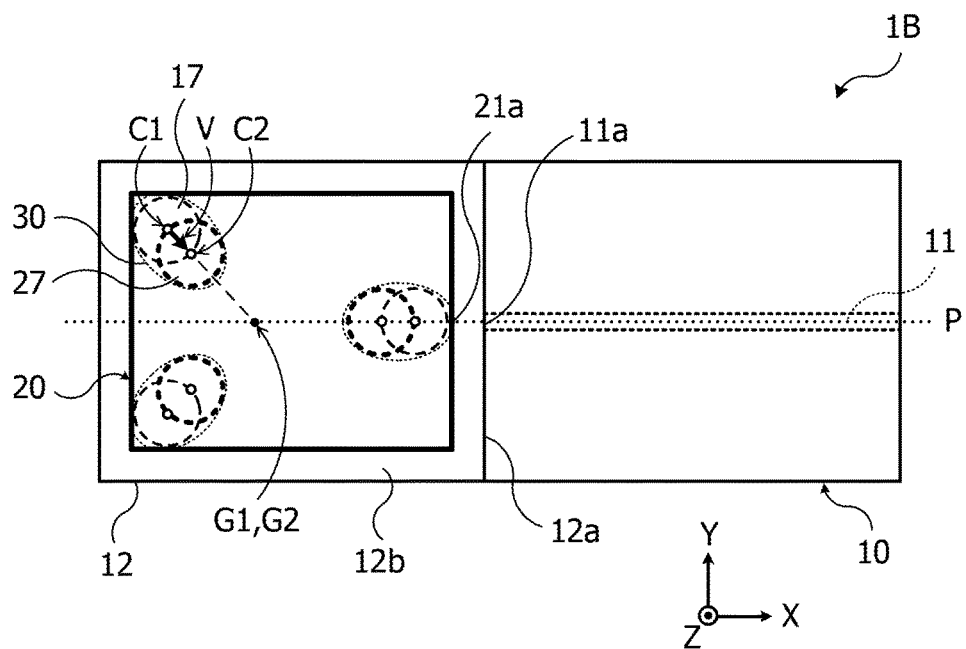

FIGS. 11A and 11B are views illustrating a second example of the optical module according to the third embodiment. FIG. 11A illustrates a schematic side view of a main part of an example of the optical module, and FIG. 11B illustrates a schematic top plan view of the main part of an example of the optical module.

An optical module 1B illustrated in FIGS. 11A and 11B has a configuration in which the group of three pads 27 is provided at predetermined positions of the semiconductor laser 20, and the group of three pads 17 is provided on the silicon photonics chip 10 so as to correspond to the group of pads 27. The semiconductor laser 20 and the silicon photonics chip 10, which have the aforementioned configuration, are bonded to each other by the group of solders 30. From this point of view, the optical module 1B is different from the optical module 1 described in the first embodiment.

In the optical module 1B, in a plan view of the group of pads 17 and the group of pads 27, the group of pads 17 are provided outside the group of pads 27, the corresponding pads 17 and 27 partially overlap, and the center of gravity G1 of the group of pads 17 coincides with the center of gravity G2 of the group of pads 27. The vector V, which interconnects the central points C1 and C2 of the corresponding pads 17 and 27, is disposed to be directed toward the coinciding centers of gravity G1 and G2. Since the group of pads 17 and the group of pads 27 are bonded by the group of solders 30 as described above, the position of the light projection portion 21a of the semiconductor laser 20 is aligned in the X, Y, and Z directions with respect to the optical waveguide 11 of the silicon photonics chip 10, and the optical axes P of the light projection portion 21a and the optical waveguide 11 are aligned.

The group of pads 27, the group of pads 17, and the group of solders 30 are set in advance such that the optical module 1B, in which the optical axes P are aligned as illustrated in FIGS. 11A and 11B by the self-alignment effect when the group of pads 17 and the group of pads 27 are bonded to each other by the group of solders 30, may be obtained. For example, the positions, the planar sizes, the planar shapes, the materials, and the like of the group of pads 27 and the group of pads 17 and the amount, the material, and the like of the group of solders 30 are set in advance.

Figure 12A:
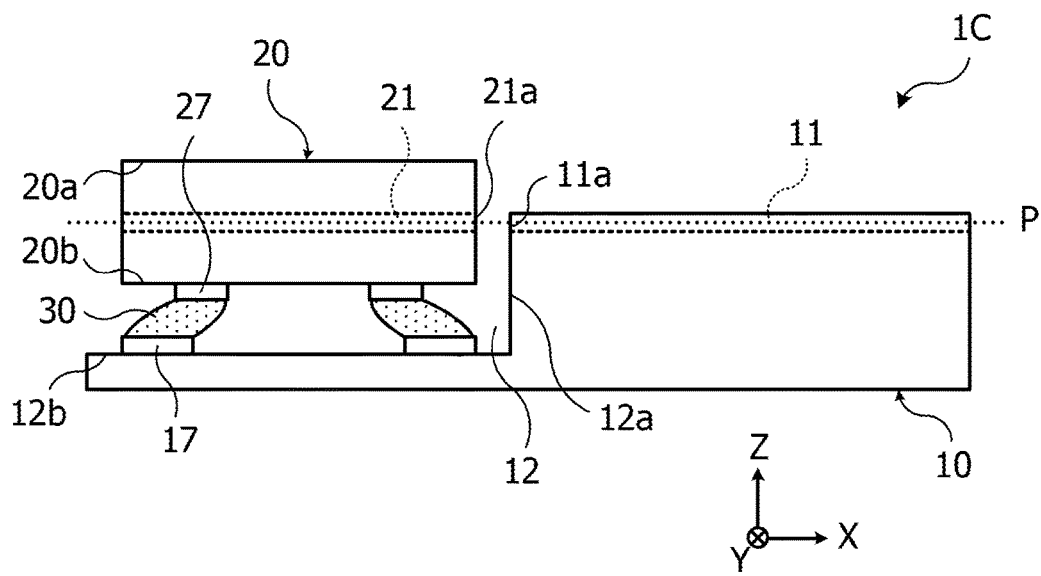
FIGS. 12A and 12B are views illustrating a third example of the optical module according to the third embodiment.
Figure 12B:
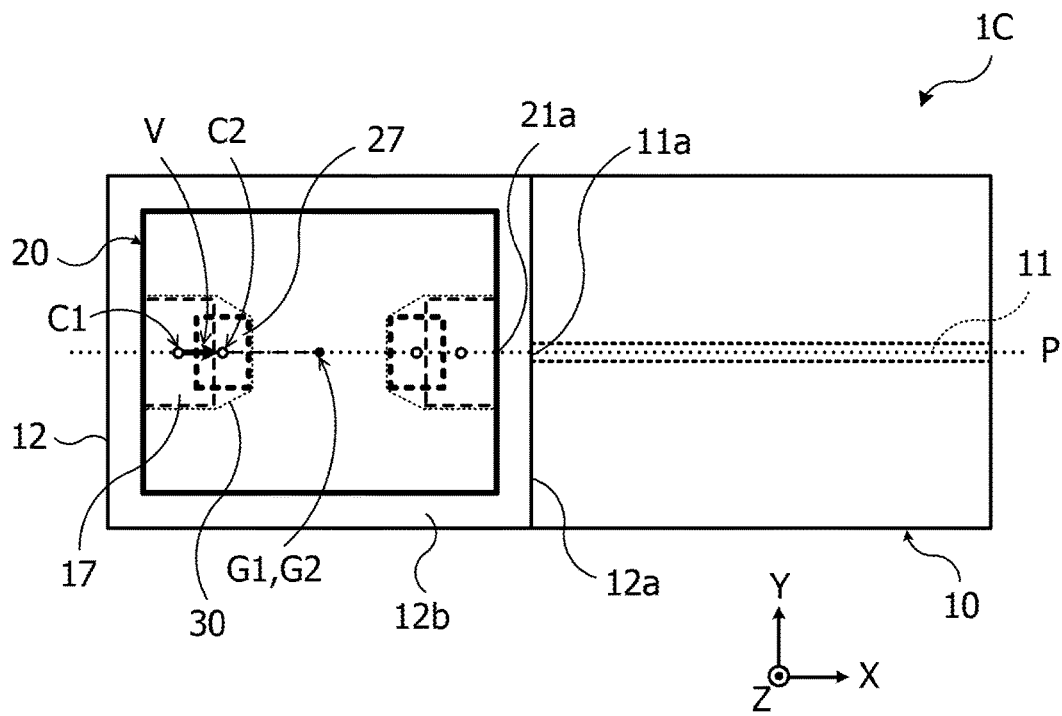

FIGS. 12A and 12B are views illustrating a third example of the optical module according to the third embodiment. FIG. 12A illustrates a schematic side view of a main part of an example of the optical module, and FIG. 12B illustrates a schematic top plan view of the main part of an example of the optical module.

An optical module 1C illustrated in FIGS. 12A and 12B has a configuration in which the group of pads 27, that is, the pair of pads 27 is provided at predetermined positions of the semiconductor laser 20, and the group of pads 17, that is, the pair of pads 17 is provided on the silicon photonics chip 10 so as to correspond to the group of pads 27. The pad 17 has a larger planar size than the pad 27. The semiconductor laser 20 and the silicon photonics chip 10, which have the aforementioned configuration, are bonded to each other by the group of solders 30. From this point of view, the optical module 1C is different from the optical module 1 described in the first embodiment.

In the optical module 1C, in a plan view of the group of pads 17 and the group of pads 27, the group of pads 17 is provided outside the group of pads 27, the corresponding pads 17 and 27 partially overlap, and the center of gravity G1 of the group of pads 17 coincides with the center of gravity G2 of the group of pads 27. The vector V, which interconnects the central points C1 and C2 of the corresponding pads 17 and 27, is disposed to be directed toward the coinciding centers of gravity G1 and G2. Since the group of pads 17 and the group of pads 27 are bonded to each other by the group of solders 30 as described above, the position of the light projection portion 21a of the semiconductor laser 20 is aligned in the X, Y, and Z directions with respect to the optical waveguide 11 of the silicon photonics chip 10, and the optical axes P of the light projection portion 21a and the optical waveguide 11 are aligned.

Since the pads 17 have a larger planar size than the pads 27 in the optical module 1C, force, which pulls the semiconductor laser 20 outward in a direction intersecting a direction facing the group of pads 27 as well as in the direction facing the group of pads 27, is applied to the semiconductor laser 20 by the surface tension of the group of molten solders 30 when bonding the semiconductor laser 20. In addition, force, which allows the semiconductor laser 20 to sink to the silicon photonics chip 10, is applied by volumetric shrinkage of the group of solders 30 which is caused by solidification. The semiconductor laser 20 is bonded by the applied force, such that the optical axis P of the semiconductor laser 20 is aligned with the optical axis P of the silicon photonics chip 10.

The group of pads 27, the group of pads 17, and the group of solders 30 are set in advance such that the optical module 1C, in which the optical axes P are aligned as illustrated in FIGS. 12A and 12B by the self-alignment effect when the group of pads 17 and the group of pads 27 are bonded to each other by the group of solders 30, may be obtained. For example, the positions, the planar sizes, the planar shapes, the materials, and the like of the group of pads 27 and the group of pads 17 and the amount, the material, and the like of the group of solders 30 are set in advance.

Figure 13A:
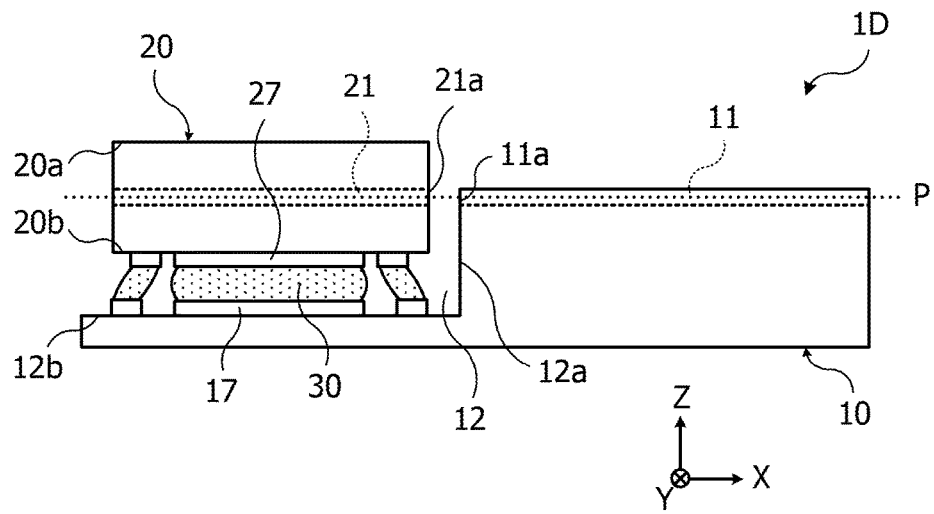
FIGS. 13A and 13B are views illustrating a fourth example of the optical module according to the third embodiment.
Figure 13B:
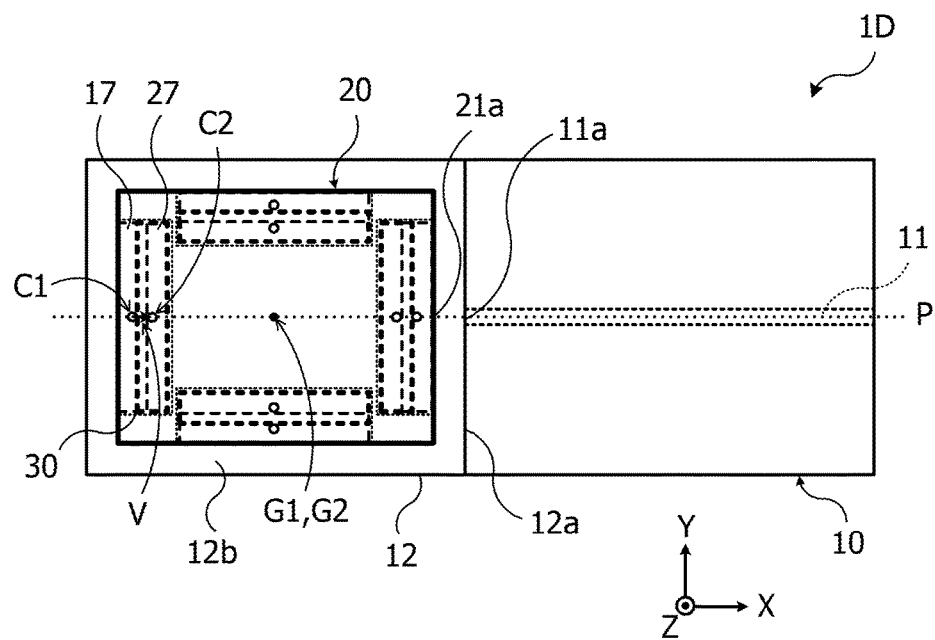

FIGS. 13A and 13B are views illustrating a fourth example of the optical module according to the third embodiment. FIG. 13A illustrates a schematic side view of a main part of an example of the optical module, and FIG. 13B illustrates a schematic top plan view of the main part of an example of the optical module.

An optical module 1D illustrated in FIGS. 13A and 13B has a configuration in which the group of pads 27 is provided at positions along four sides of the semiconductor laser 20, and the group of pads 17 is provided on the silicon photonics chip 10 so as to correspond to the group of pads 27. The semiconductor laser 20 and the silicon photonics chip 10, which have the aforementioned configuration, are bonded by the group of solders 30. From this point of view, the optical module 1D is different from the optical module 1 described in the first embodiment.

In the optical module 1D, in a plan view of the group of pads 17 and the group of pads 27, the group of pads 17 are provided outside the group of pads 27, the corresponding pads 17 and 27 partially overlap, and the center of gravity G1 of the group of pads 17 coincides with the center of gravity G2 of the group of pads 27. The vector V, which connects the central points C1 and C2 of the corresponding pads 17 and 27, is disposed to be directed toward the coinciding centers of gravity G1 and G2. Since the group of pads 17 and the group of pads 27 are bonded by the group of solders 30 as described above, the position of the light projection portion 21a of the semiconductor laser 20 is aligned in the X, Y, and Z directions with respect to the optical waveguide 11 of the silicon photonics chip 10, and the optical axes P of the light projection portion 21a and the optical waveguide 11 are aligned.

Force, which pulls the four sides of the semiconductor laser 20 outward, is applied to the semiconductor laser 20 by the surface tension of the group of molten solder 30 when bonding the semiconductor laser 20, and force, which allows the semiconductor laser 20 to sink to the silicon photonics chip 10, is applied by the volumetric shrinkage of the group of solders 30 which is caused by solidification. The semiconductor laser 20 is bonded by the applied force, such that the optical axis P of the semiconductor laser 20 is aligned with the optical axis P of the silicon photonics chip 10.

The group of pads 27, the group of pads 17, and the group of solders 30 are set in advance such that the optical module 1D, in which the optical axes P are aligned as illustrated in FIGS. 13A and 13B by the self-alignment effect when the group of pads 17 and the group of pads 27 are bonded by the group of solders 30, may be obtained. For example, the positions, the planar sizes, the planar shapes, the materials, and the like of the group of pads 27 and the group of pads 17 and the amount, the material, and the like of the group of solders 30 are set in advance.

In the optical module 1D, the group of pads 27 may be disposed such that the adjacent pads 27 abut against each other, and the group of pads 17 may be disposed such that the adjacent pads 17 abut against each other. In a case in which all of the adjacent pads 27 of the group of pads 27 are disposed to abut against each other, the group of pads 27 is formed in the form of a series of frames, and in a case in which all of the adjacent pads 17 of the group of pads 17 are disposed to abut against each other, the group of pads 17 is formed in the form of a series of frames.

It is not necessary to necessarily provide the group of pads 27 of the semiconductor laser 20 at the four corners of the bottom surface 20b similar to the optical modules 1A, 1B, 1C, and 1D. The group of pads 17 may be provided on the bottom surface 12b of the recess 12 of the silicon photonics chip 10 so that the group of pads 17 corresponds to the positions of the group of pads 27 of the semiconductor laser 20, and the semiconductor laser 20 is bonded at a predetermined position where the optical axis P of the semiconductor laser 20 is aligned with the optical axis P of the silicon photonics chip 10. The arrangement of the group of pads 27 and the group of pads 17, which are used for the alignment (alignment between the optical axes), may be set in response to the configuration of the semiconductor laser 20 or the silicon photonics chip 10 such as an arrangement of unevenness, which is provided on the bottom surface 20b or the bottom surface 12b of the recess 12, or a pattern shape of the conductor layer.

The number of groups of pads 27 provided on the semiconductor laser 20 may be five or more. Even in this case, the group of pads 17 is provided on the silicon photonics chip 10 so that the group of pads 17 corresponds to the group of pads 27 of the semiconductor laser 20, and the semiconductor laser 20 is bonded at a predetermined position where the optical axis P of the semiconductor laser 20 is aligned with the optical axis P of the silicon photonics chip 10.

Next, a fourth embodiment will be described. Here, an example of an optical module, in which the semiconductor laser 20 is used as the optical element, the silicon photonics chip 10 is used as the substrate, and still another arrangement of the group of pads 17 and the group of pads 27 is adopted, will be described as the fourth embodiment.

Figure 14A:
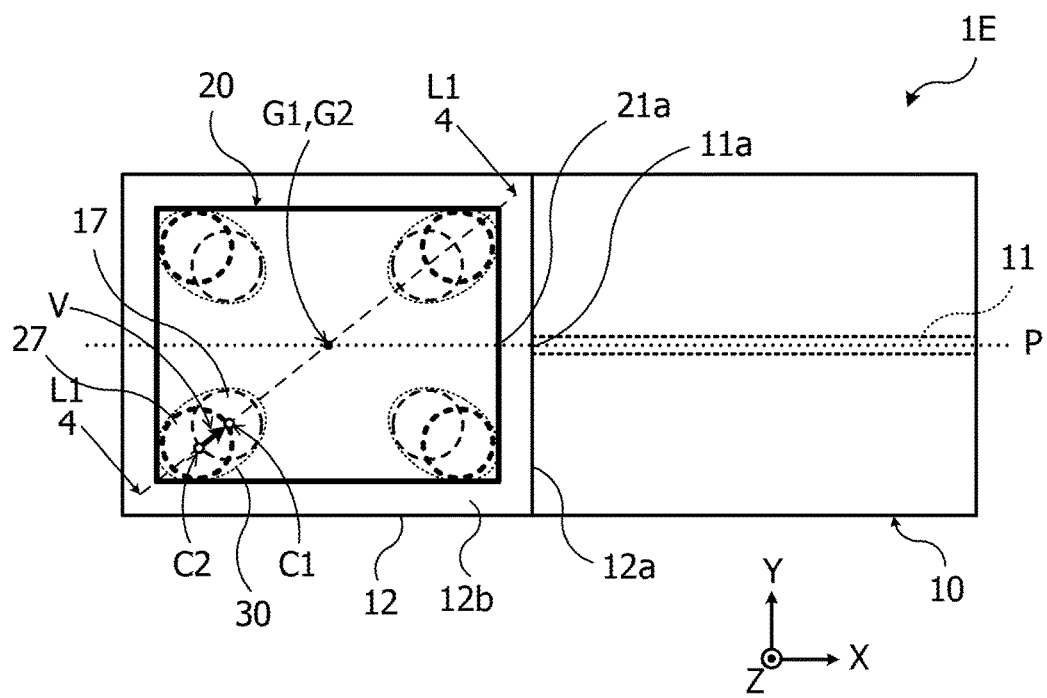
FIGS. 14A and 14B are views illustrating an example of an optical module according to a fourth embodiment.
Figure 14B:
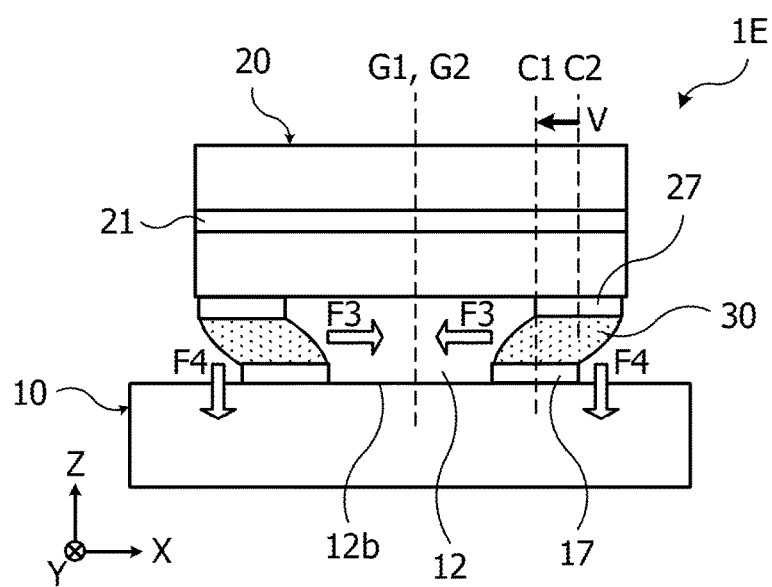

FIGS. 14A and 14B are views illustrating an example of the optical module according to the fourth embodiment. FIG. 14A illustrates a schematic top plan view of a main part of the example of the optical module, and FIG. 14B illustrates a schematic cross-sectional view taken along line L14-L14 in FIG. 14A.

An optical module 1E illustrated in FIGS. 14A and 14B has a configuration in which the group of pads 17 is provided on the silicon photonics chip 10 at positions displaced inward from the group of pads 27 provided at the four corners of the semiconductor laser 20. From this point of view, the optical module 1E is different from the optical module 1 described in the first embodiment.

In the optical module 1E, in a plan view of the group of pads 17 and the group of pads 27, the corresponding pads 17 and 27 partially overlap, and the center of gravity G1 of the group of pads 17 coincides with the center of gravity G2 of the group of pads 27. The vector V, which interconnects the central points C2 and C1 of the corresponding pads 27 and 17, is disposed to be directed toward the coinciding centers of gravity G1 and G2. Since the group of pads 17 and the group of pads 27 are bonded to each other by the group of solders 30 as described above, the position of the light projection portion 21a of the semiconductor laser 20 is aligned in the X, Y, and Z directions with respect to the optical waveguide 11 of the silicon photonics chip 10, and the optical axes P of the light projection portion 21a and the optical waveguide 11 are aligned.

Force F3, which pulls the semiconductor laser 20 in a direction toward the center of gravity G2 (vector V), is applied to the semiconductor laser 20 by the surface tension of the group of molten solder 30 when bonding the semiconductor laser 20. In addition, force F4, which allows the semiconductor laser 20 to sink to the silicon photonics chip 10, is applied by the volumetric shrinkage of the group of solders 30 which is caused by solidification. The semiconductor laser 20 is bonded to each other by the applied force F3 and the applied force F4 such that the optical axis P of the semiconductor laser 20 is aligned with the optical axis P of the silicon photonics chip 10.

The group of pads 27, the group of pads 17, and the group of solders 30 are set in advance such that the optical module 1E, in which the optical axes P are aligned as illustrated in FIGS. 14A and 14B by the self-alignment effect when the group of pads 17 and the group of pads 27 are bonded by the group of solders 30, may be obtained. For example, the positions, the planar sizes, the planar shapes, the materials, and the like of the group of pads 27 and the group of pads 17 and the amount, the material, and the like of the group of solders 30 are set in advance.

Similar to the optical module 1E, the group of pads 17 of the silicon photonics chip 10 may be disposed to be displaced inward from the group of pads 27 of the semiconductor laser 20. In a case in which the configuration in which the group of pads 17 is disposed to be displaced inward from the group of pads 27 as described above is adopted, the number of groups of pads 17 and the number of groups of pads 27, and the planar sizes and the planar shapes of the group of pads 17 and the group of pads 27 are not limited to the example illustrated in FIGS. 14A and 14B. In addition, according to description in the third embodiment, the group of pads 27 may be provided at positions different from the four corners, the number of groups of pads 27 may not be four, the group of pads 27 may be provided along the side, and the group of pads 17, which correspond to the group of pads 27, may be provided to be displaced inward from the group of pads 27.

Next, a fifth embodiment will be described. Here, an example of an optical module will be described as the fifth embodiment in a case in which the semiconductor laser 20 is used as the optical element, the silicon photonics chip 10 is used as the substrate, and another component is combined with the semiconductor laser 20 and the silicon photonics chip 10.

Figure 15A:
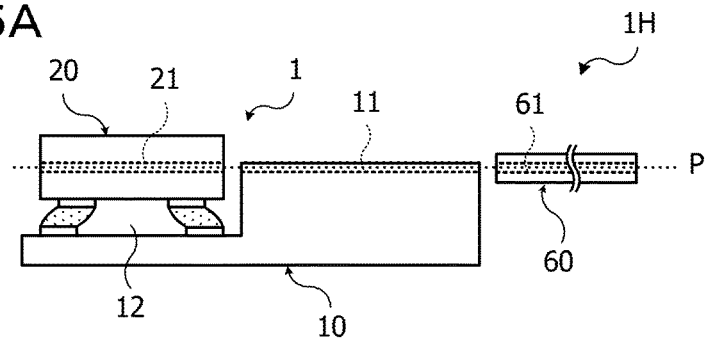
FIGS. 15A to 15C are views illustrating an example of an optical module according to a fifth embodiment.
Figure 15B:
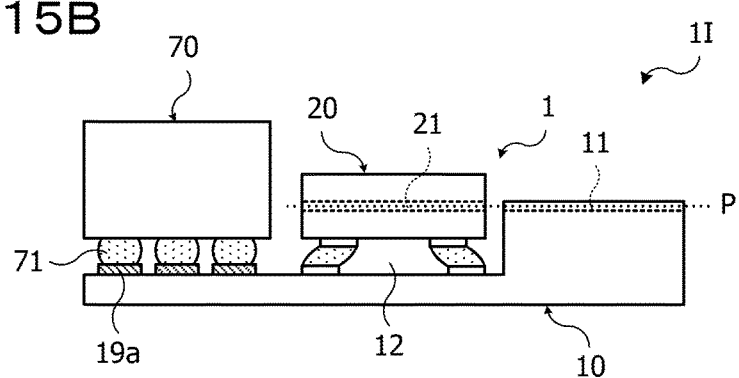
Figure 15C:
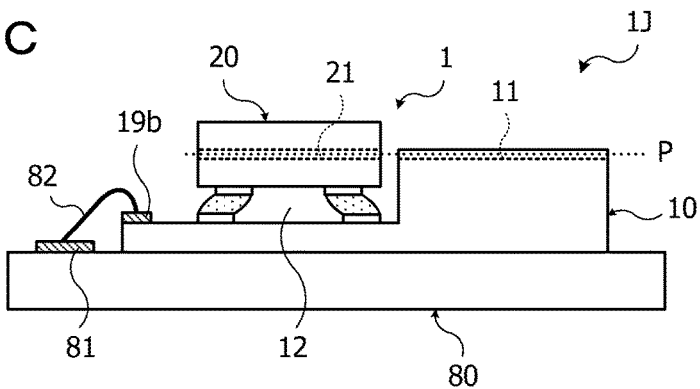

FIGS. 15A to 15C are views illustrating an example of the optical module according to the fifth embodiment. FIGS. 15A to 15C illustrate schematic side views of a main part of an example of an optical module, respectively. FIG. 15A illustrates an optical module 1H including an optical fiber 60. For example, as illustrated in FIG. 15A, the optical fiber 60 may be optically connected to the optical module 1 described in the first embodiment. The position of a core 61 of the optical fiber 60 is aligned with the position of the optical waveguide 11 of the silicon photonics chip 10, and the optical axes P of the core 61 and the optical waveguide 11 are aligned.

FIG. 15B illustrates an optical module 1I including a control chip 70 (semiconductor element). For example, as illustrated in FIG. 15B, the control chip 70 for controlling an operation of the semiconductor laser 20, together with the semiconductor laser 20, may be mounted in the recess 12 of the silicon photonics chip 10 in the optical module 1 described in the first embodiment. The control chip 70 is bonded to conductor layers 19a, which are made of copper or the like and formed in the recess 12 of the silicon photonics chip 10, by solder 71.

FIG. 15C illustrates an optical module 1J including a circuit board 80. For example, as illustrated in FIG. 15C, the optical module 1 described in the first embodiment may be mounted on the circuit board 80 such as a package substrate or a motherboard. In this case, for example, the silicon photonics chip 10 is electrically connected to the circuit board 80 as a conductor layer 19b, which is made of copper or the like and formed in the recess 12, is connected to a conductor layer 81, which is made of copper or the like and formed on the circuit board 80, through a wire 82 made of gold or the like.

The optical module 1 described in the first embodiment has been described as an example with reference to FIGS. 15A to 15C, but similarly, the optical fiber 60 may be connected to the optical modules 1A to 1E described in the second to fourth embodiments, the control chip 70 may be mounted on the optical modules 1A to 1E described in the second to fourth embodiments, and the optical modules 1A to 1E described in the second to fourth embodiments may be mounted on the circuit board 80.

Next, a sixth embodiment will be described. An optical module including the configuration described in the first to fifth embodiments may be mounted on the various types of electronic apparatuses. For example, the optical modules may be used for various types of electronic apparatuses such as computers (personal computers, super computers, servers, etc.), smartphones, mobile phones, tablet terminals, sensors, cameras, audio devices, measuring devices, inspection devices, and manufacturing devices.

Figure 16:
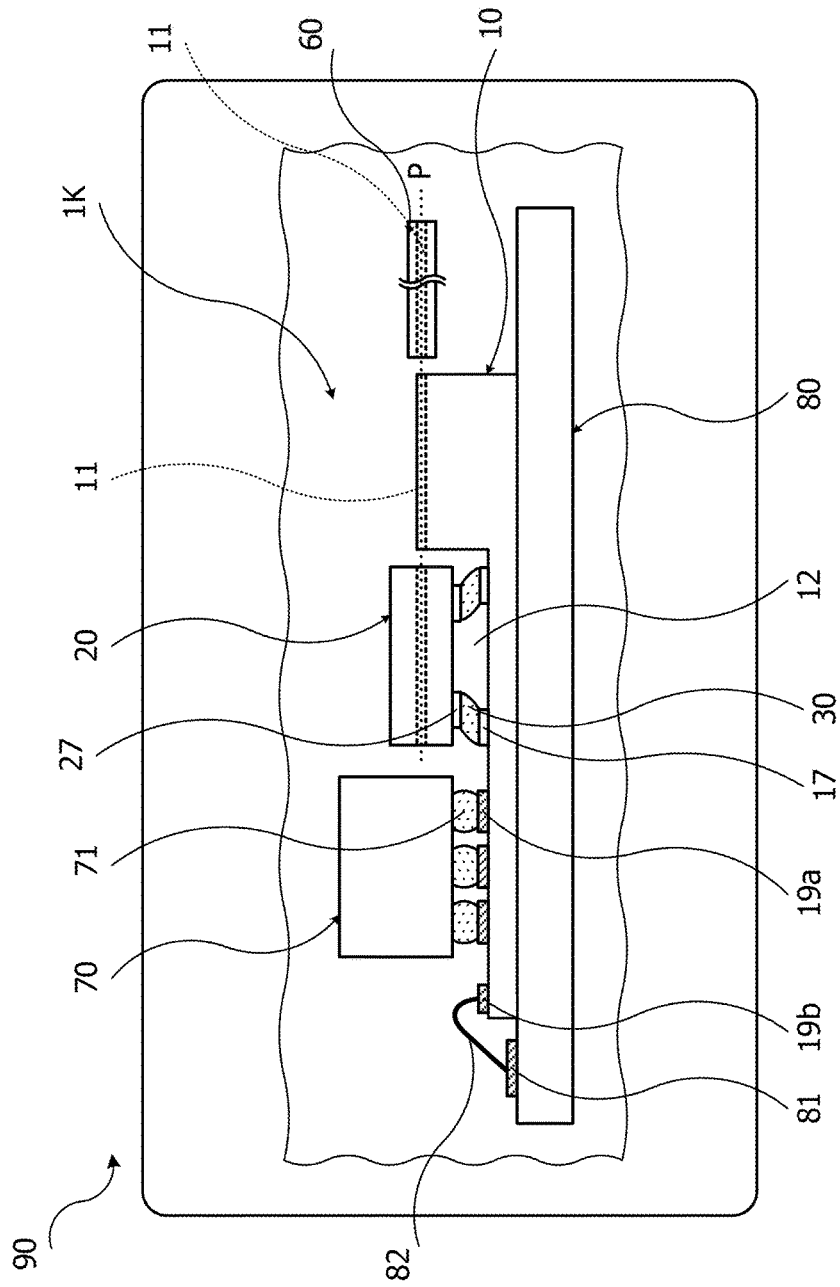
FIG. 16 is an explanatory view of an electronic apparatus according to a sixth embodiment.

FIG. 16 is an explanatory view of an electronic apparatus according to the sixth embodiment. FIG. 16 schematically illustrates an example of an electronic apparatus. As illustrated in FIG. 16, an optical module 1K is mounted (embedded) in various types of electronic apparatuses 90.

Here, the optical module 1K includes a circuit board 80, a silicon photonics chip 10 mounted on the circuit board 80, a semiconductor laser 20, a control chip 70, and the optical fiber 60 optically connected to the optical waveguide 11. The semiconductor laser 20 and the control chip 70 are mounted in the recess 12 of the silicon photonics chip 10. The circuit board 80 and the silicon photonics chip 10 are electrically connected to each other through the wire 82 which interconnects the conductor layer 81 and the conductor layer 19b. The control chip 70 is electrically connected to the conductor layer 19a of the silicon photonics chip 10 by the solder 71. The optical axis P of the semiconductor laser 20 is aligned with the optical axis P of the silicon photonics chip 10 as the group of pads 27 of the semiconductor laser 20 is bonded to the group of pads 17 of the silicon photonics chip 10 by the group of solders 30. The optical fiber 60 is optically connected to the silicon photonics chip 10.

In the optical module 1K, the ON/OFF operation of the laser beam of the semiconductor laser 20 is controlled by the control chip 70, and the laser beam exiting from the semiconductor laser 20 is transmitted to the optical waveguide 11, and then transmitted to the optical fiber 60.

As described in the first embodiment, the group of pads 27 and the group of pads 17 are disposed on the semiconductor laser 20 and the silicon photonics chip 10 while the positions of the group of pads 27 and the group of pads 17 are displaced such that the optical axes P of the semiconductor laser 20 and the silicon photonics chip 10 are aligned with each other by the self-alignment effect when the semiconductor laser 20 and the silicon photonics chip 10 are bonded by the group of solders 30. Therefore, it is possible to effectively obtain the optical module 1K, which has excellent optical properties and in which the optical axes P of the semiconductor laser 20 and the silicon photonics chip 10 are aligned with high precision, while inhibiting an increase in costs. The electronic apparatus 90, which has the optical module 1K mounted therein and has excellent properties, is implemented.

Here, the optical module 1K illustrated in FIG. 16 has been described as an example, but similarly, the optical modules 1, and 1A to 1E described in the first to fourth embodiments or an optical module partially including the configurations of the optical modules 1, and 1A to 1E may be mounted in various types of electronic apparatuses.

In the aforementioned description, the semiconductor laser 20 has been described as an example of the optical element, but various types of light receiving elements, light emitting elements, light receiving and emitting elements such as a photo diode (PD) or a light emitting diode (LED) may be used as the optical element. In addition, the silicon photonics chip 10 has been described as an example of the substrate, but various types of circuit boards such as a print substrate, a package substrate, an interposer, and a motherboard, or a base substrate having no circuit pattern may be used as the substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
    an optical element having a group of first pads which is formed on a first surface thereof;
    a substrate having a group of second pads which is formed on a second surface thereof facing the first surface so as to correspond to the group of first pads, respectively; and
    a group of solders that respectively bonds the group of first pads and the group of second pads to each other,
    in a plan view, a second pad of the substrate is disposed to be displaced toward an outward side from a corresponding first pad of the optical element along with a line directed from a center of the second pad to a center of gravity of the group of second pads such that the corresponding first and second pads only partially overlap with each other when the solders are solidified in a bonding process, and
    a center of gravity of the group of first pads coincides with the center of gravity of the group of second pads, and a vector interconnecting a center of the first pad of the optical element and the center of the corresponding second pad of the substrate is directed toward centers of gravity of the group of first pads and the group of second pads which coincide with each other.

2. The optical module according to claim 1, wherein the substrate has an optical waveguide, an end portion of which is positioned on an optical axis of the optical element bonded by the group of solders.

3. The optical module according to claim 1, wherein the substrate includes a conductor layer formed on the second surface and electrically coupled to the group of second pads.

4. The optical module according to claim 1, wherein the substrate includes a conductor layer formed on the second surface and separated from the group of second pads, and the conductor layer is electrically coupled to the optical element by using a bonding material.

* * * * *